United States Patent
Costantini et al.

(10) Patent No.: US 10,197,794 B2
(45) Date of Patent: Feb. 5, 2019

(54) MICRO-ELECTRO-MECHANICAL DEVICE WITH A MOVABLE STRUCTURE, IN PARTICULAR MICROMIRROR, AND MANUFACTURING PROCESS THEREOF

(71) Applicant: STMicroelectronics S.r.l., Agrate Brianza (IT)

(72) Inventors: Sonia Costantini, Missaglia Lecco (IT); Marta Carminati, Casatenovo (IT); Daniela Angela Luisa Gatti, Bussero (IT); Laura Maria Castoldi, Abbiategrasso (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/603,614

(22) Filed: May 24, 2017

(65) Prior Publication Data
US 2018/0180871 A1 Jun. 28, 2018

(30) Foreign Application Priority Data

Dec. 28, 2016 (IT) .................. 102016000131865

(51) Int. Cl.
*G02B 26/08* (2006.01)
*B81B 3/00* (2006.01)
(Continued)

(52) U.S. Cl.
CPC ........ *G02B 26/0833* (2013.01); *B81B 3/0083* (2013.01); *B81C 1/00714* (2013.01); *G02B 26/105* (2013.01); *B81B 2201/032* (2013.01); *B81B 2201/042* (2013.01); *B81B 2203/0307* (2013.01); *B81B 2203/058* (2013.01); *B81C 2203/032* (2013.01)

(58) Field of Classification Search
CPC ..... B81B 3/00; B81B 3/007; B81B 2201/042; G02B 6/3518; G02B 26/0841; G02B 26/00; G02B 26/0833; G02B 26/085; G02B 26/101
USPC ........................................ 359/214.1
See application file for complete search history.

(56) References Cited

U.S. PATENT DOCUMENTS

2011/0310452 A1* 12/2011 Lin ..................... G02B 26/085
359/200.7
2014/0285871 A1 9/2014 Moidu

FOREIGN PATENT DOCUMENTS

JP 2014056211 A 3/2014

OTHER PUBLICATIONS

IT Search Report and Written Opinion for IT Appl. No. 102016000131865 dated Oct. 13, 2017 (7 pages).

* cited by examiner

*Primary Examiner* — Euncha Cherry
(74) *Attorney, Agent, or Firm* — Crowe & Dunlevy

(57) ABSTRACT

A micro-electro-mechanical (MEMS) device is formed in a first wafer overlying and bonded to a second wafer. The first wafer includes a fixed part, a movable part, and elastic elements that elastically couple the movable part and the fixed part. The movable part further carries actuation elements configured to control a relative movement, such as a rotation, of the movable part with respect to the fixed part. The second wafer is bonded to the first wafer through projections extending from the first wafer. The projections may, for example, be formed by selectively removing part of a semiconductor layer. A composite wafer formed by the first and second wafers is cut to form many MEMS devices.

20 Claims, 32 Drawing Sheets

(51) Int. Cl.
*B81C 1/00* (2006.01)
*G02B 26/10* (2006.01)

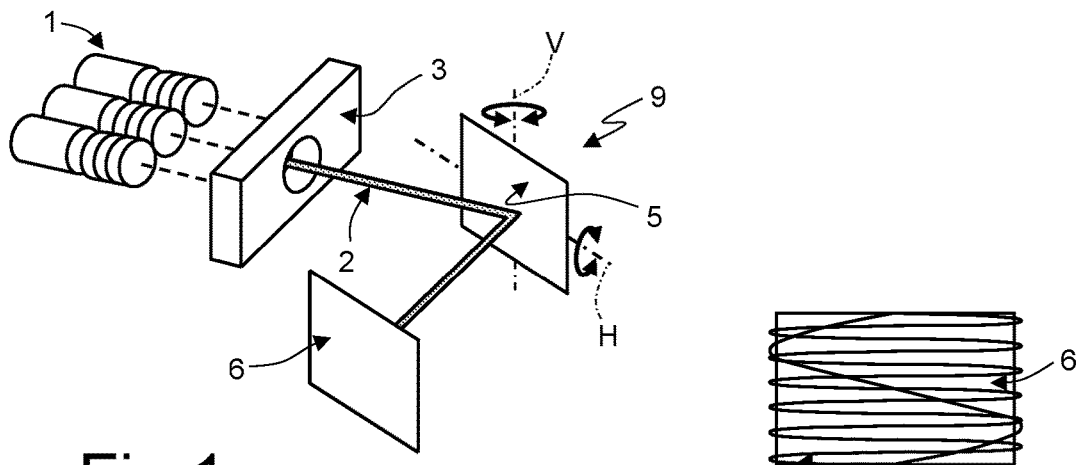
Fig.1
Fig.2
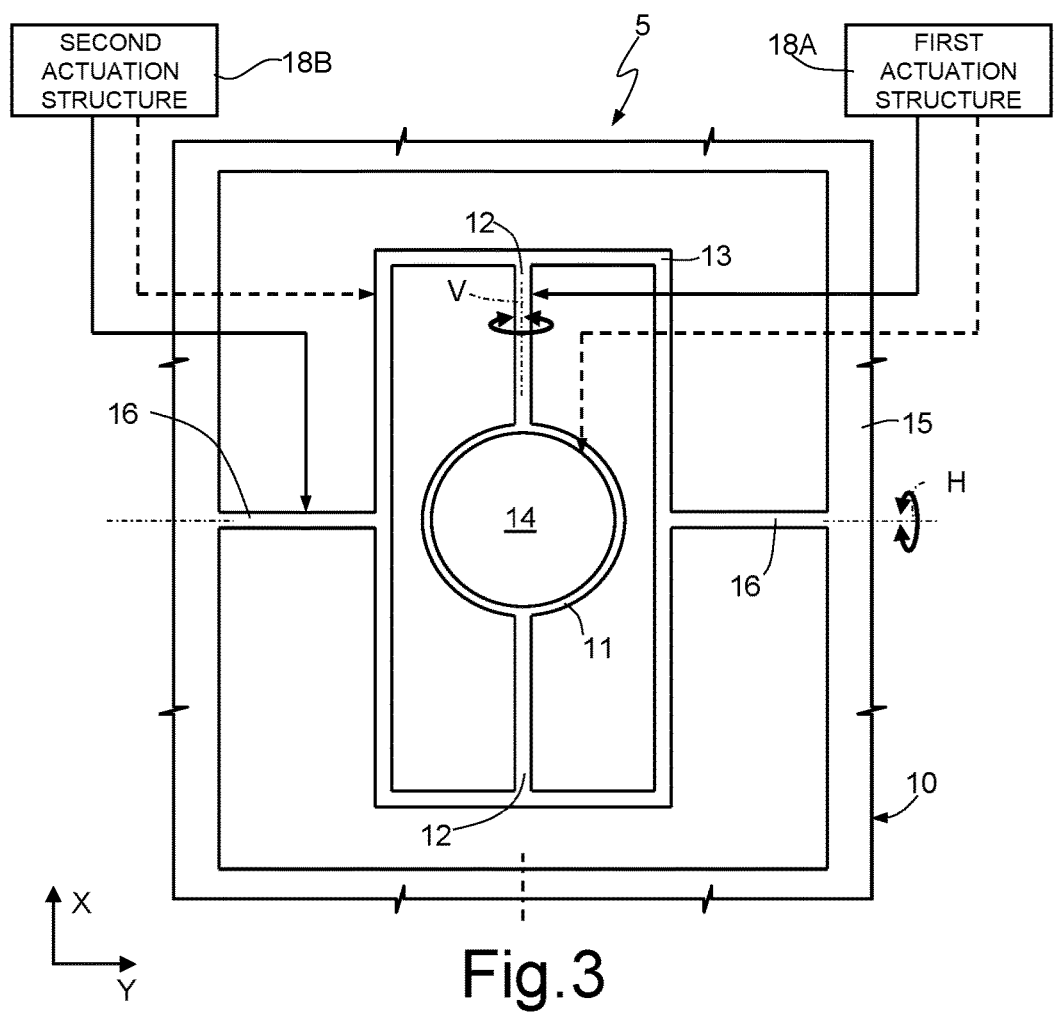
Fig.3

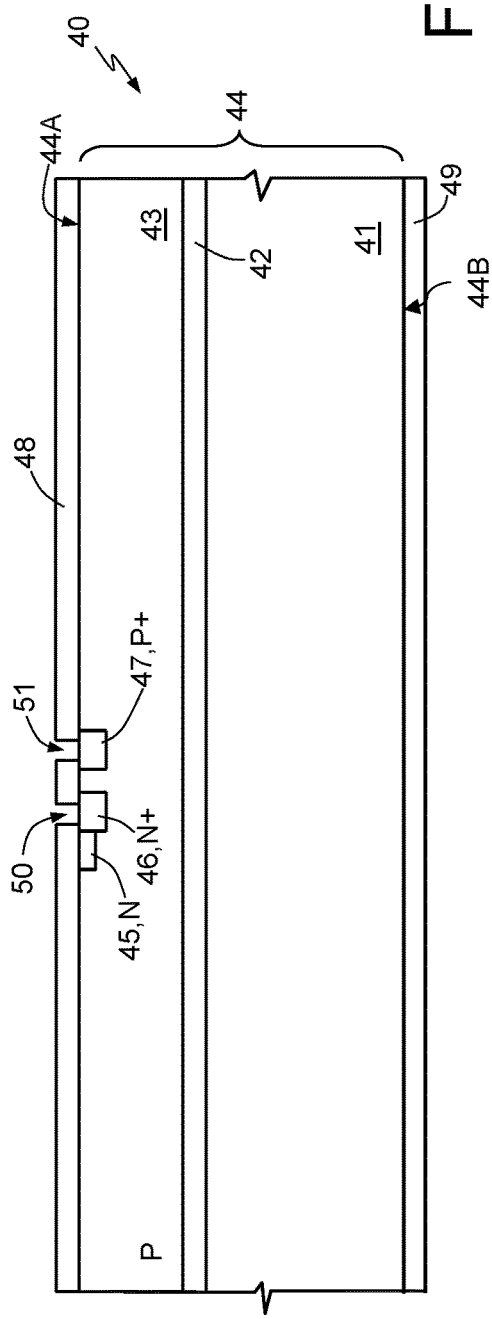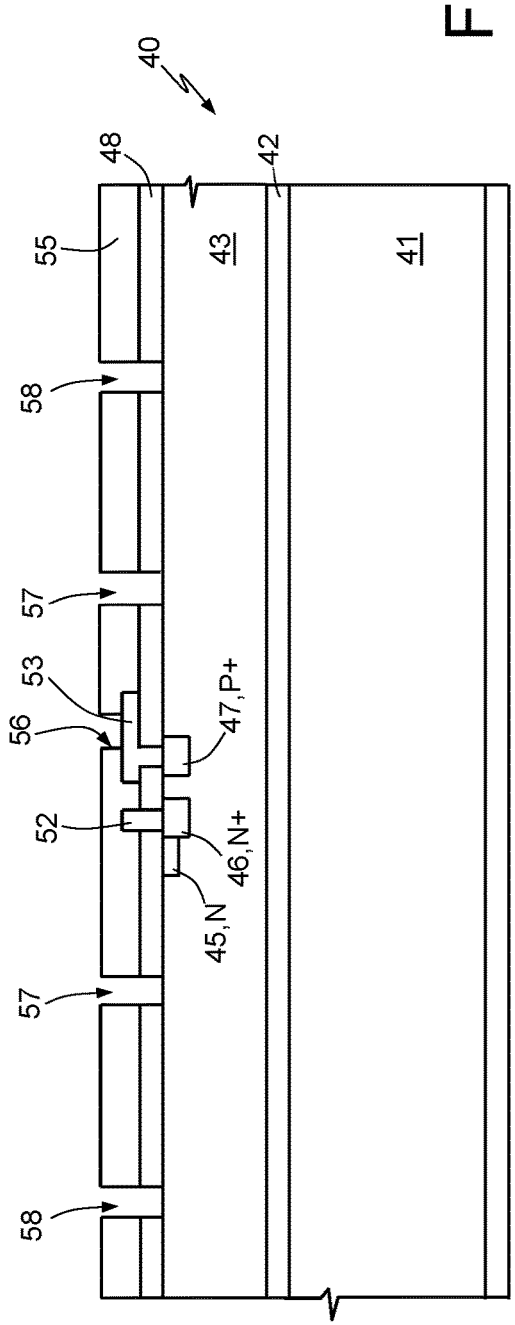

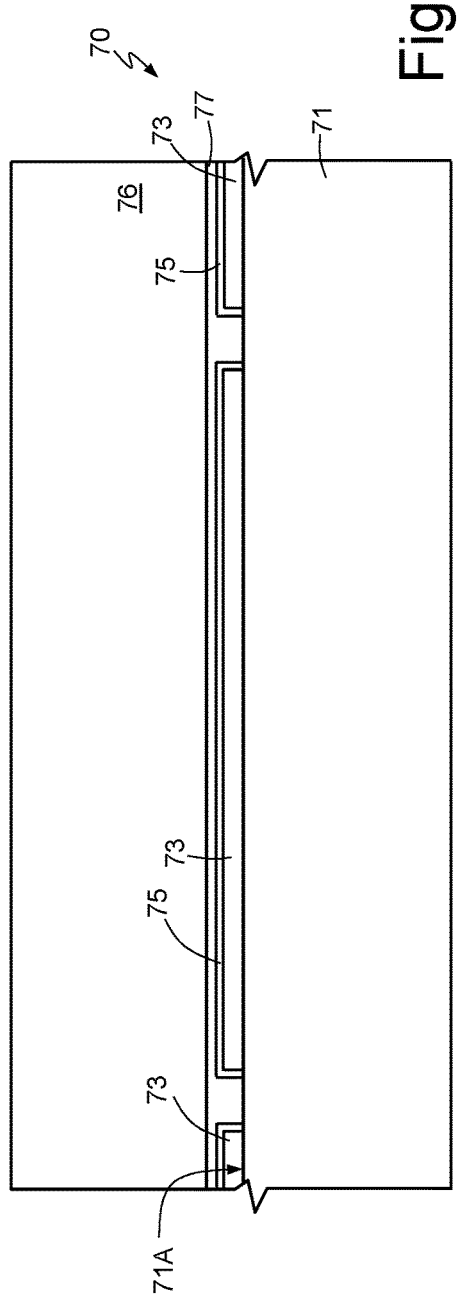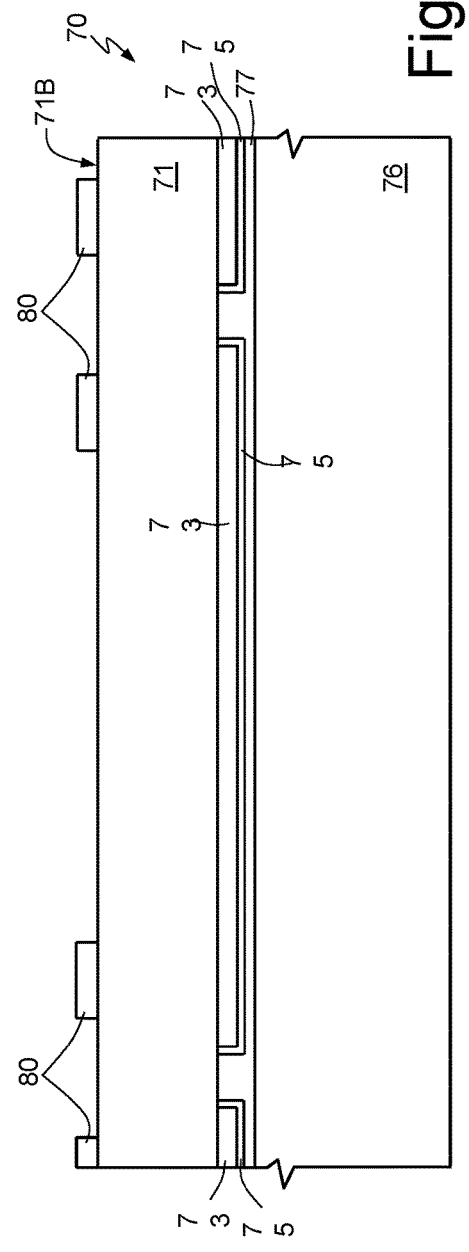

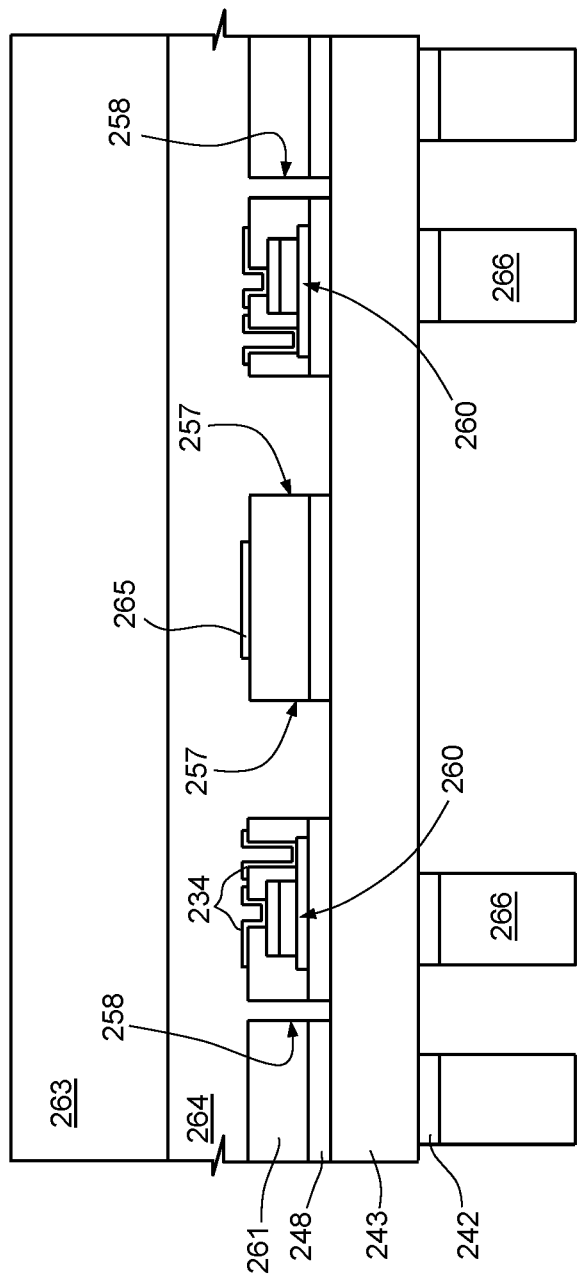

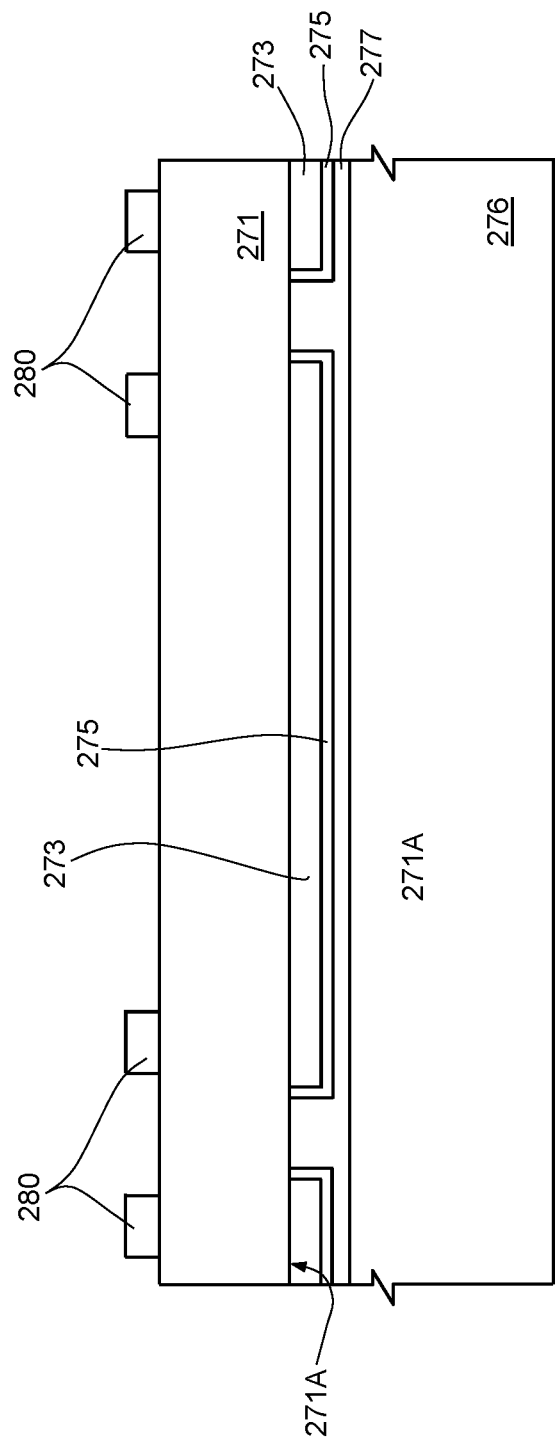

MICRO-ELECTRO-MECHANICAL DEVICE WITH A MOVABLE STRUCTURE, IN PARTICULAR MICROMIRROR, AND MANUFACTURING PROCESS THEREOF

PRIORITY CLAIM

This application claims the priority benefit of Italian Application for Patent No. 102016000131865, filed on Dec. 28, 2016, the disclosure of which is hereby incorporated by reference in its entirety.

TECHNICAL FIELD

The present invention relates to a micro-electro-mechanical device with a movable structure, in particular a micromirror, and to the manufacturing process thereof.

BACKGROUND

MEMS (Micro-Electro-Mechanical Systems) devices are known having a mirror structure manufactured using the semiconductor material technology.

These MEMS devices are, for example, used in portable apparatuses, such as portable computers, laptops, notebooks (including ultra-thin notebooks), PDAs, tablets, cellphones, and smartphones, for optical applications, in particular for directing light beams generated by a light source with desired modalities.

By virtue of their small dimensions, these devices are able to meet stringent requirements as regards the occupation of space, in terms of area and thickness.

For example, micro-electro-mechanical mirror devices are used in miniaturized projector modules (so called picoprojectors) which are able to project images at a distance or to generate desired patterns of light.

Micro-electro-mechanical mirror devices generally include a mirror element suspended over a cavity and manufactured from a semiconductor material body so as to be mobile, typically with an inclination/tilting or rotation movement, for directing the incident light beam in a desired way.

For example, FIG. 1 schematically shows a picoprojector 9 comprising a light source 1, typically a laser source, generating a light beam 2 made up of three monochromatic beams, one for each base color, which, through an optical system 3 shown only schematically, is deflected by a mirror element 5 in the direction of a display 6. In the example shown, the mirror element 5 is of a two-dimensional type, driven so as to turn about a vertical axis V and a horizontal axis H. Rotation of the mirror element 5 about the vertical axis V generates a fast horizontal scan, as shown in FIG. 2. Rotation of the mirror element 5 about the horizontal axis B, perpendicular to the vertical axis V, generates a slow vertical scan, typically of a saw tooth type.

In a different embodiment of the system of FIG. 1, the system comprises two micromirrors, arranged in sequence on the path of the light beam 2, each of which is able to rotate about an own axis; namely, one is rotatable about the horizontal axis B, and the other is rotatable about the vertical axis V so as to generate the same scanning scheme as shown in FIG. 2.

Another application of micromirror systems is in a three-dimensional (3D) gesture recognition system. These systems normally use a picoprojector and an image acquisition device, such as a camera. The light ray here may be in the range of visible light, invisible light, or any useful frequency. The picoprojector for this application may be similar to the picoprojector 9 of FIG. 1, and the light beam 2 deflected by the micromirror 5 is used for scanning an object in two directions. For example, the picoprojector may project small stripes on the object. Any projecting or recessed areas of the object (due to the depth thereof) create deformations in the light rays detected by the camera, which may be processed by suitable electronics for detecting the third dimension.

In both cases, with the considered technology, rotation of the mirror element is driven via an actuation system, generally of an electrostatic, magnetic, or piezoelectric type.

FIG. 3 shows a mirror element 5 of a biaxial type with generic actuation. Here, a die 10 comprises a suspended region 11 extending over a substrate (not visible) and carrying a reflecting surface 14. The suspended region 11 is supported by a suspended frame 13 by a first pair of arms 12 having elastically deformable portions, which form first torsion springs. The first arms 12 extend on opposite sides of the suspended region 11 and define the rotation axis V of the mirror element 5. The suspended frame 13 is connected to a fixed peripheral portion 15 of the die 10 via a second pair of arms 16 having elastically deformable portions, which form second torsion springs and enable rotation of the suspended frame 13 and of the suspended region 11 about the horizontal axis B. A first actuation structure 18A (shown only schematically and of an electrostatic, magnetic, or piezoelectric type) is coupled to the first arms 12 or to the suspended region 11 and is configured to cause a rotation actuation movement of the first arms 12 about the vertical axis V (parallel to an axis X of a Cartesian reference system XYZ), as a function of first electrical driving signals. A second actuation structure 18B (shown only schematically and of an electrostatic, magnetic, or piezoelectric type) is coupled to the second arms 16 or to the suspended frame 13 and is configured to cause a rotation actuation movement of the second arms 16 about the horizontal axis H (parallel to an axis Y of the Cartesian reference system XYZ), as a function of second electrical driving signals.

Rotation of the mirror element 5 about the vertical axis V that causes the horizontal scan occurs with an angle generally of ±12°, and rotation of the mirror element 5 about the horizontal axis H that causes the vertical scan generally occurs with an angle of ±8°.

To ensure proper operation, the angular position of the mirror element 5 is generally controlled via sensing elements. In fact, minor deviations of the physical or electrical characteristics of the structures, due to the variability in the production lots, to assembly imprecisions, or to different operating conditions, such as temperature or ageing, may lead to even considerable errors in the direction of the emitted light beam.

To this end, sensors of the angular position of the micromirror element are generally integrated in the die 10. Usually, these sensors are based upon capacitive or piezoelectric principles.

Currently, MEMS micromirrors with an increasingly higher optical resolution are required. Since the optical resolution is related to the size of the reflecting surface, this requirement results in the need for increasingly larger reflecting surfaces, up to 7 mm.

However, this entails a considerable and undesirable increase in the overall dimensions of the device, in so far as added to the space occupied by the reflecting surface are the spaces required by the actuation elements, by the position sensors, and by possible other driving, control, and management elements, integrated in the same die.

There is a need in the art to provide a micro-electro-mechanical device and a corresponding manufacturing process that overcome the drawbacks of the prior art.

SUMMARY

In an embodiment, a micro-electro-mechanical device comprises: a first monolithic body including semiconductor material; and a second monolithic body including semiconductor material, overlying the first monolithic body. The first monolithic body comprises a fixed part, a movable part, and elastic elements elastically coupling the movable part and the fixed part; the movable part carrying actuation elements configured to control a relative movement of the movable part with respect to the fixed part. The first monolithic body includes projections, extending from the movable part and bonded to the second monolithic body.

In an embodiment, a process for manufacturing a micro-electro-mechanical device comprises: forming projections extending from a first portion of a first monolithic body comprising semiconductor material; superimposing a second monolithic body comprising semiconductor material on the first monolithic body; bonding the projections of the first monolithic body to the second monolithic body and forming a composite body; forming actuation elements inside or on the first portion of the first monolithic body; and defining the first monolithic body to form a fixed part, a movable part, and elastic elements, the movable part carrying the actuation elements and having the projections, and the elastic elements coupling the movable part to the fixed part.

In an embodiment, a micro-electro-mechanical device comprises: a first monolithic body including semiconductor material, wherein the first monolithic body includes a fixed part, a movable part forming a frame surrounding the fixed part, and elastic elements configured to elastically couple the movable part and the fixed part to support oscillation of the movable part relative to the fixed part about an oscillation axis; a plurality of projections extending perpendicular to a surface of the movable part; a second monolithic body including semiconductor material, wherein the second monolithic body has a bottom surface mounted to the plurality of projections with the second monolithic body extending over the movable part of the first monolithic body; and a mirror layer mounted to a top surface of the second monolithic body that is opposite the bottom surface.

BRIEF DESCRIPTION OF THE DRAWINGS

For a better understanding of the present invention, preferred embodiments thereof are now described, purely by way of non-limiting example, with reference to the attached drawings, wherein:

FIG. 1 is a schematic representation of a picoprojector;

FIG. 2 shows the projection scheme of an image generated by the picoprojector of FIG. 1 on a display;

FIG. 3 is a simplified top plan view of a microelectronic micromirror device;

FIGS. 6A-6K are cross sections through silicon wafers in successive manufacturing steps of an embodiment of the present device;

FIGS. 8A-8K are cross sections of silicon wafers in successive manufacturing steps of a different embodiment of the present device;

DETAILED DESCRIPTION

In the following description, embodiments will be described where the micromirror is rotatable only about one axis, and precisely a vertical axis. However, they may be modified in a simple way for two axes detection.

Figure 4:
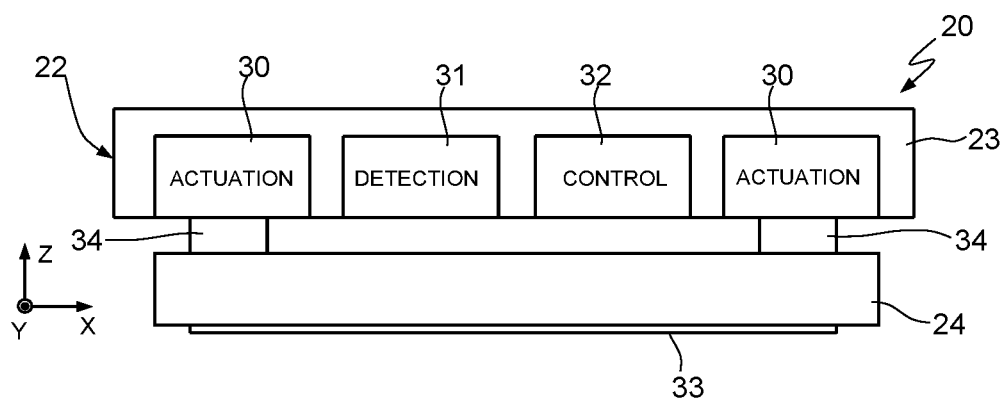
FIG. 4 is a schematic cross section of the present device.
Figure 5:
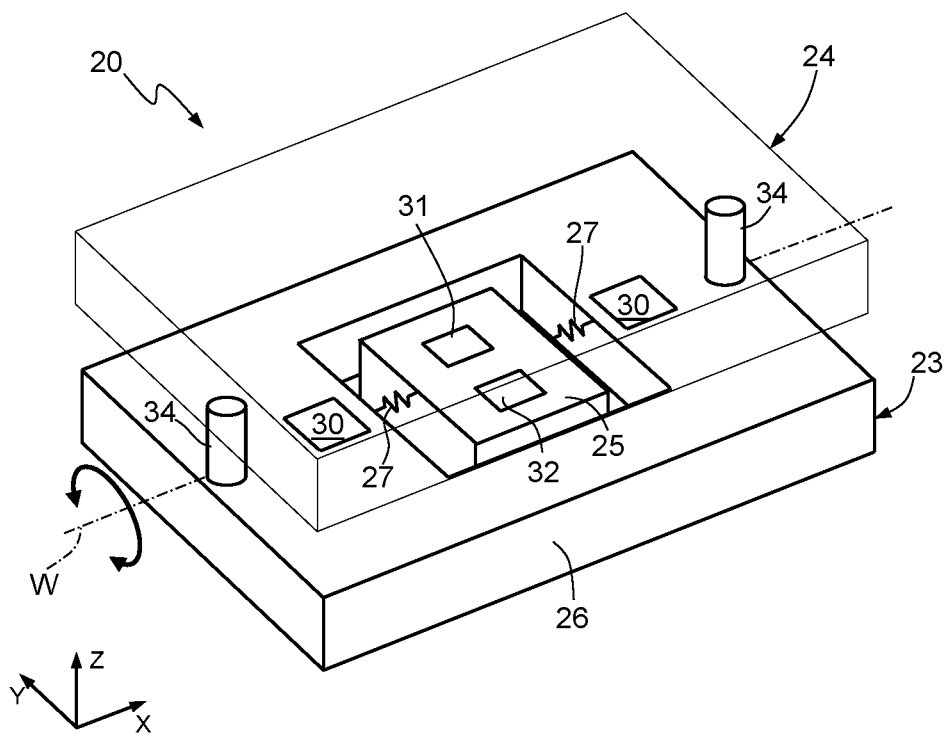
FIG. 5 is a simplified perspective bottom view of the device of FIG. 4.

FIGS. 4 and 5 are schematic illustrations of a MEMS device 20 forming a micromirror. The MEMS device 20 is formed in a die 22 including a first body 23 and a second body 24. The first body 23 comprises a fixed part 25 housing or carrying a position sensing structure 31 and possible other driving, supply, and control elements 32, and a movable part 26, for example frame-like shaped, surrounding the fixed part 25 and carrying actuation elements 30. The fixed part 25 and the movable part 26 are connected together via elastic elements 27 that allow the movable part 26 to move according to one or more desired degrees of freedom.

The actuation elements 30 form part of an actuation structure that may be of a magnetic type (in which case the actuation elements 30 may comprise a coil configured to couple to a magnetic structure external to the MEMS device 20); of an electrostatic type (in which case the actuation elements 30 may comprise mobile electrodes capacitively coupled to fixed electrodes formed on the fixed part 25); or of a piezoelectric type (in which case the actuation elements 30 may comprise piezoelectric regions that cause controlled deformations of the movable part 26 when supplied with current), in a per se known manner.

In the considered case, the movable part 26 is orientable (i.e., it may be tilted) about an axis W parallel to the axis X of a Cartesian coordinate system XYZ, and the elastic elements 27 are torsion bars. The second body 24 (shown in ghost view of FIG. 5) here carries a reflecting surface 33, not shown for sake of clarity in FIG. 5, and is fixed to the first body 23 via projections 34, bonded to the second body 24. The projections 34 are, for example, columns, extending monolithically from the movable part 26 of the first body 23 towards the second body 24. The projections 34 form mechanical connection structures transmitting the rotation movement generated by the actuation elements 30 to the second body 24 and thus to the reflecting surface 33. Thereby, for example, a rotation movement of the tilting part 26 about an axis W parallel to axis X (for example, vertical axis V of FIGS. 1 and 3) generated by the actuation elements 30 is transferred to the reflecting surface 33.

In the device 20, the actuation elements 30, the sensing element 31, and possible other driving, supply, and control elements 42 are formed in the first body 23, within the bulk thereof (in a plane parallel to plane XY of the Cartesian coordinate system XYZ). As a consequence, the overall dimensions of the device 20 in directions X and Y are substantially determined only by the planar dimensions of the reflecting surface 33, which may be maximized.

Embodiments of devices 20 with magnetic, electrostatic, and piezoelectric actuation are shown in FIGS. 6A-6J, 7A-7G, and 8A-8J, respectively. These figures show wafers accommodating portions of a MEMS device. In a per se known manner in the semiconductor technology, other portions of the wafers are simultaneously processed so as to form a plurality of MEMS devices arranged adjacent to each other, which are then separated by dicing, as shown in FIGS. 6K, 7H, and 8K.

An exemplary manufacturing process of a MEMS device with magnetic actuation is shown in FIGS. 6A-6K and described hereinafter.

In FIG. 6A, a first structural wafer 40 comprises a layer stack 44 including a first semiconductor layer 41 (for instance, of monocrystalline silicon having a thickness of, for example, 600-700 µm), an insulating layer 42 (for instance, of silicon oxide having a thickness of approximately 1 µm), and a second semiconductor layer 43 (for instance, of monocrystalline silicon having a thickness, for example, of 20 to 60 µm). The layer stack 44 has a first surface 44A, formed by the second semiconductor layer 43, and a second surface 44B, formed by the first semiconductor layer 41. An oxide layer 49 may extend on the second surface 44B of the layer stack 44. The layer stack 44 is, for example, an SOI (Silicon-On-Insulator) substrate. The first structural wafer 40 is initially processed to create sensing structures, by forming doped regions in the second semiconductor layer 43, through the first surface 44A of the stack 44. To this end, and in a manner not shown, first dopant ion species of a first type (for example, N type phosphorus, when the second layer 43 is of a P type) are selectively implanted, thus forming piezoresistors 45 (one whereof is shown). Second dopant ion species of the first type are selectively implanted to form piezoresistor contact regions 46 contiguous to the piezoresistors 45 (one whereof is shown). Third dopant ion species of a second type, for example, P type boron, are selectively implanted to form substrate contact regions 47 (one whereof is shown). Then, a first dielectric layer 48 is formed on the first surface 44A of the layer stack 44, for instance by deposition. The first dielectric layer is, for example, silicon oxide or nitride and is also referred to as premetal dielectric layer 48. The premetal dielectric layer 48 is selectively removed over the piezoresistor contact regions 46 and the substrate contact regions 47 to form first and second openings 50, 51.

Next, FIG. 6B, contact regions are formed in the openings 50, 51 by depositing a metal layer (for example, aluminum or gold), masking, and defining the metal layer. Resistor contacts 52 (one whereof shown) are thus formed in the first openings 50 in direct electrical contact with the piezoresistor contact regions 46, and, in the second openings 51, substrate contacts 53 (one whereof shown) are formed, in direct electrical contact with the substrate contact regions 47. Then, a second dielectric layer, also called intermetal dielectric layer 55, is formed, for example by deposition. The intermetal dielectric layer 55 is selectively etched and removed above the substrate contacts 53 to form third openings 56. Further, the intermetal dielectric layer 55 and the premetal dielectric layer 48 are selectively etched and removed so as to form structure definition vias 57 and separation vias 58, which extend as far as the second semiconductor layer 43. The definition vias 57 are subsequently used for defining the actuation elements in the first structural wafer 40, and thus their geometry follows the actuation elements to be formed, whereas the separation vias 58 are intended to simplify dicing of different MEMS devices in the wafer, and thus separate the structures of adjacent MEMS devices, as explained hereinafter.

Figure 6C:
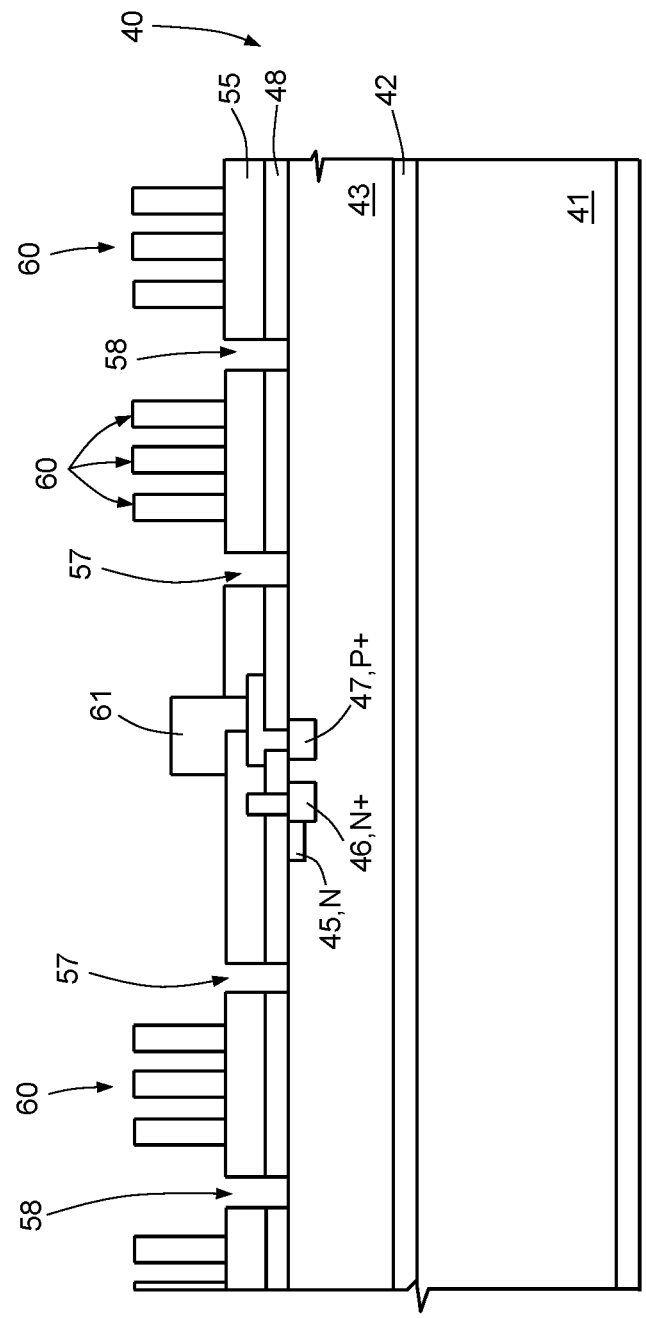

Next, FIG. 6C, the magnetic actuation elements and corresponding electrical connections are formed. To this end, a seed layer is deposited, a mask (not shown) is formed, the seed layer is defined, and metal is galvanically grown, to form a coil 60, FIG. 6C shows cross sections of some turns thereof) on the intermetal dielectric layer 55. The coil 60 is formed on the portion of the second semiconductor layer 43 intended to form the movable part 26 of the device 20 of FIGS. 4 and 5. Using similar process steps (including forming seed regions and thick growth), interconnection regions 61 (one whereof is shown only partially) are formed and extend in part in the third openings 56 and in part over the intermetal dielectric layer 55. The two galvanic growths enable forming thick metal regions, each optimized as regards material, thickness, and electrical characteristics, in a differentiated way for the coil 60 and the interconnection regions 61. For example, the material of the coil 60 may be copper, which has suitable characteristics as regards obtainable growth thickness, resistivity, and cost, whereas the interconnection regions 61 (which may comprise also contact pads, not visible) may be formed by a layer stack, including gold. It should be noted that the order of forming the coil 60 and the interconnection regions 61 is not important, and they may be formed in a reverse sequence with respect to the above.

Figure 6D:
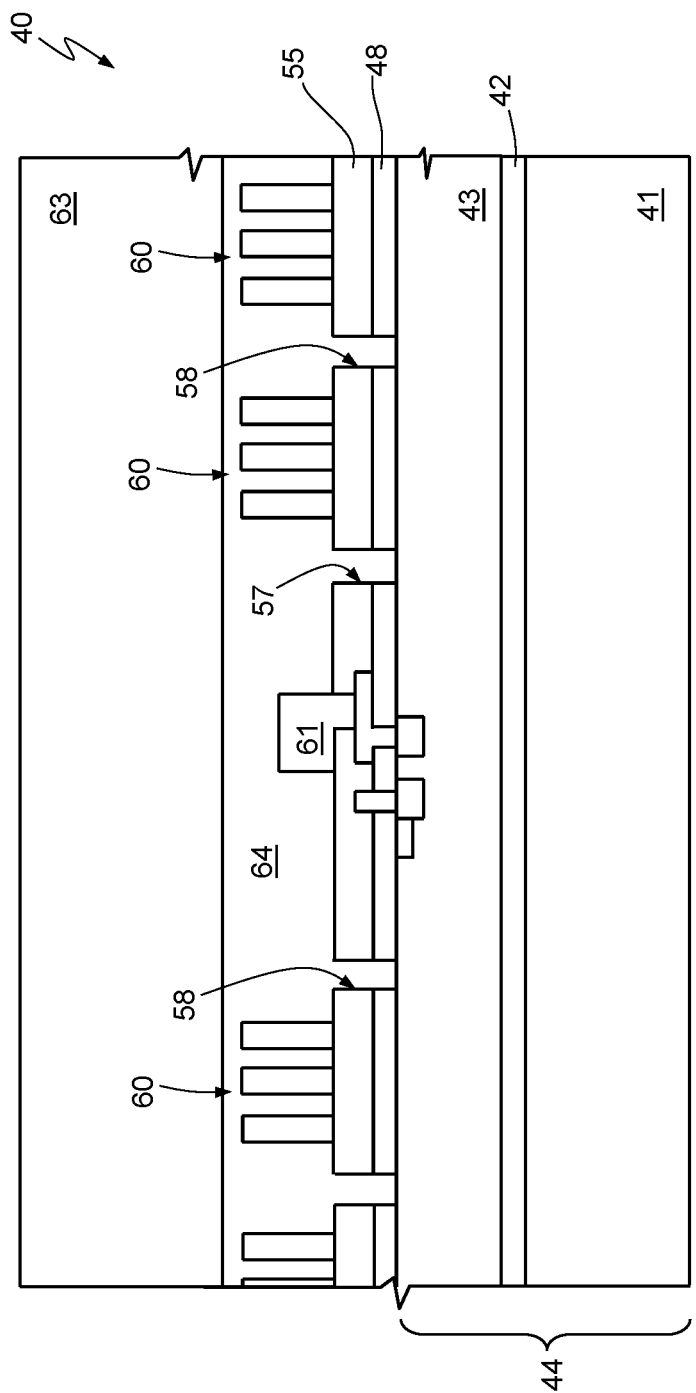

Then, FIG. 6D, the first layer 41 of the layer stack 44 is thinned. To this end, a first supporting wafer 63 is previously bonded to the intermetal dielectric layer 55 through a first temporary bonding layer 64. The first supporting wafer 63 has a protection and stiffening function and may be a monocrystalline silicon wafer. The first temporary bonding layer 64 may be made of any material allowing simple bonding and then release at temperatures sufficiently low as not to damage the components formed in the meantime, as discussed in further detail hereinafter. For instance, the first temporary bonding layer 64 may be an organic adhesive layer, for example with a carbon base applied by spin coating, in a per se known manner. After bonding the first supporting wafer 63, the first layer 41 of the layer stack 44 is thinned, for example by grinding, so that the layer stack 44 has an overall thickness of 100-150 µm. A polishing etch is then preferably carried out.

Figure 6E:
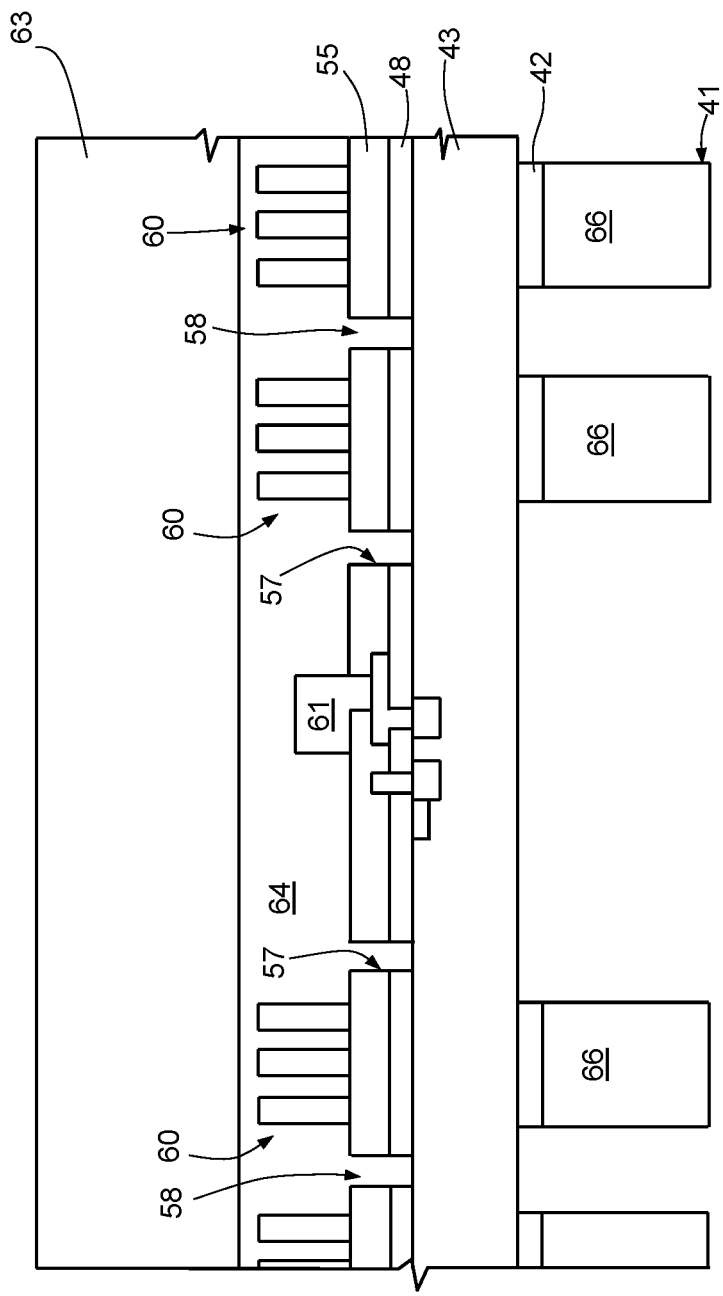

Next, FIG. 6E, the first layer 41 and the insulating layer 42 of the layer stack 44 are selectively removed, by masking and etching, to form mirror supporting regions 66. The mirror supporting regions 66 have the aim of supporting and transmitting the actuation to the reflecting surfaces of the finished MEMS devices, as discussed hereinafter. It should be noted that, in FIG. 6E, the mirror supporting regions 66 are arranged on opposite sides of the vertical lines through the separation vias 58, thus simplifying the separation process of the MEMS devices, as clarified hereinafter.

Simultaneously, before or after the steps of FIGS. 6A-6E, a second structural wafer 70 is processed, FIG. 6F. The second structural wafer 70 comprises a substrate 71, for example of monocrystalline silicon, having a first surface 71A. Alternatively, the second structural wafer 70 may comprise an SOI substrate or a layer stack including a substrate, an oxide layer, and a polycrystalline silicon layer, epitaxially grown. A reflecting layer has been deposited on the first surface 71A of the substrate 71 and defined, to form reflecting regions 73, for example, of metal material, such as aluminum, gold, silver, platinum or an alloy thereof. Furthermore, in the example, a coating layer 75, has been already deposited on the reflecting regions 73 and defined; for example a silicon oxide protective layer or a reflectivity increasing layer, such as a multilayer formed by high refractive index layers with alternating with low refractive index layers, even though this is not necessary. Alternatively, the reflecting regions 73 are formed by dielectric materials formed by a layer stack, including high refractive index layers alternating with low refractive index layers.

In FIG. 6F, a second supporting wafer 76, for example of monocrystalline silicon, has been bonded on the second structural wafer 70 using a second temporary bonding layer 77. The second temporary bonding layer 77 is applied on the first surface 71A of the substrate 71 and on the protective coating layer 75 and may be an adhesive tape, for example of a thermal release type, preferably of a material having softening characteristics different from the first temporary bonding layer 64 so that detachment of the first supporting wafer 63 and of the second supporting wafer 77 occurs at different times, as discussed hereinafter.

As shown in FIG. 6G, the substrate 71 is then thinned, for example by grinding and subsequent polishing by chemical etching or chemical/mechanical treatment, until a thickness of less than 120 µm. The substrate 71 thus has a second surface 71B with adhesive regions 80 printed thereon. The adhesive regions 80 allow a permanent bonding, activatable at low temperature, without damaging the first and second temporary bonding layers 64, 77. To this end, for example, a printed epoxy glue is used of the same material as for die attach, usual in semiconductor devices, in particular in MEMS devices.

Figure 6H:
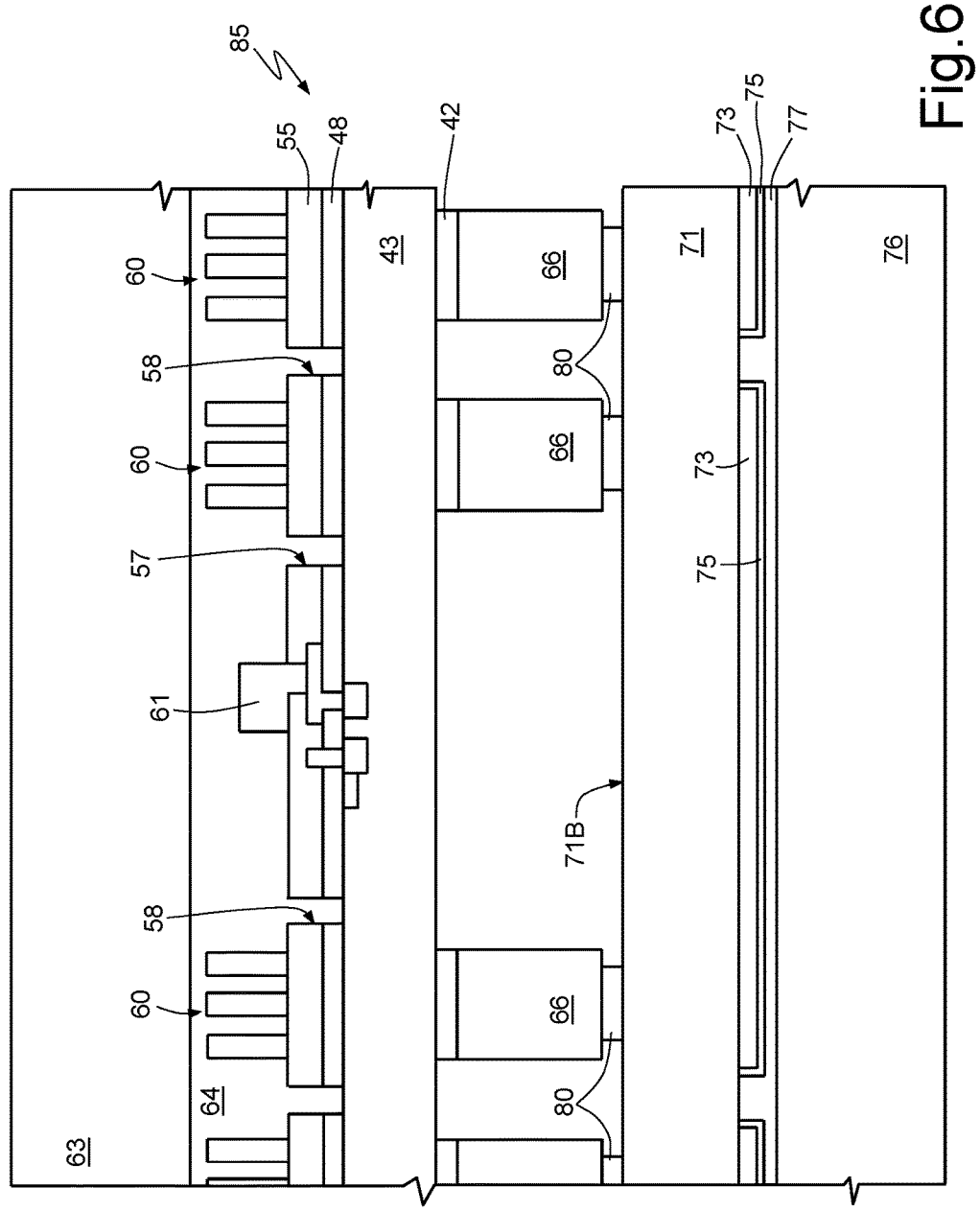

Then, FIG. 6H, the first structural wafer 40 and the second structural wafer 70 are bonded through the adhesive regions 80. In particular, the adhesive regions 80 are arranged to be aligned to the mirror supporting regions 66, and the latter is bonded to the second surface 71B of the substrate 71. A composite wafer 85 is thus formed.

Figure 6I:
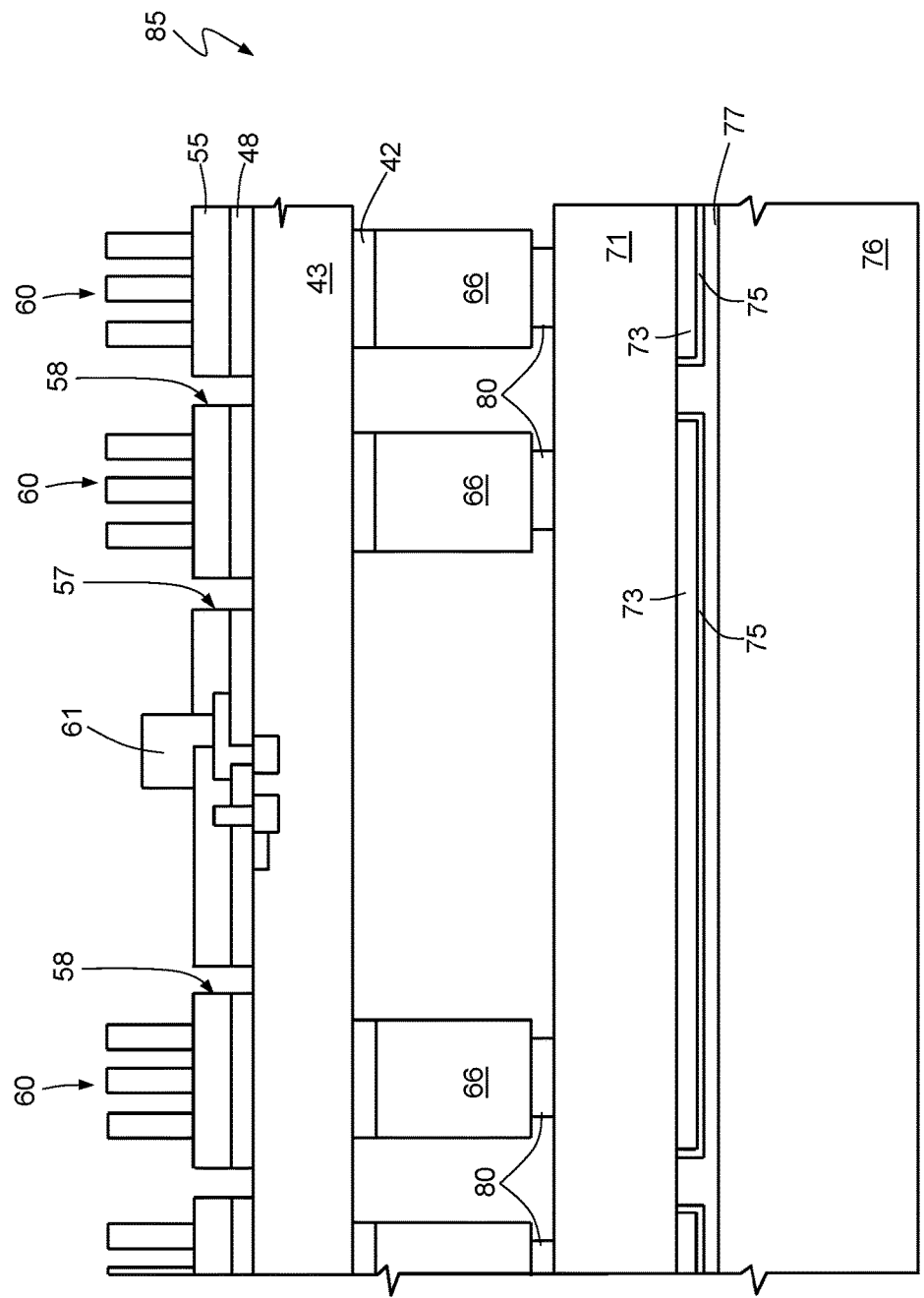

In FIG. 6I, the first supporting wafer 63 is detached by carrying out a thermal treatment at medium temperature, for example at 140° C., and then performing a cleaning treatment.

Figure 6J:
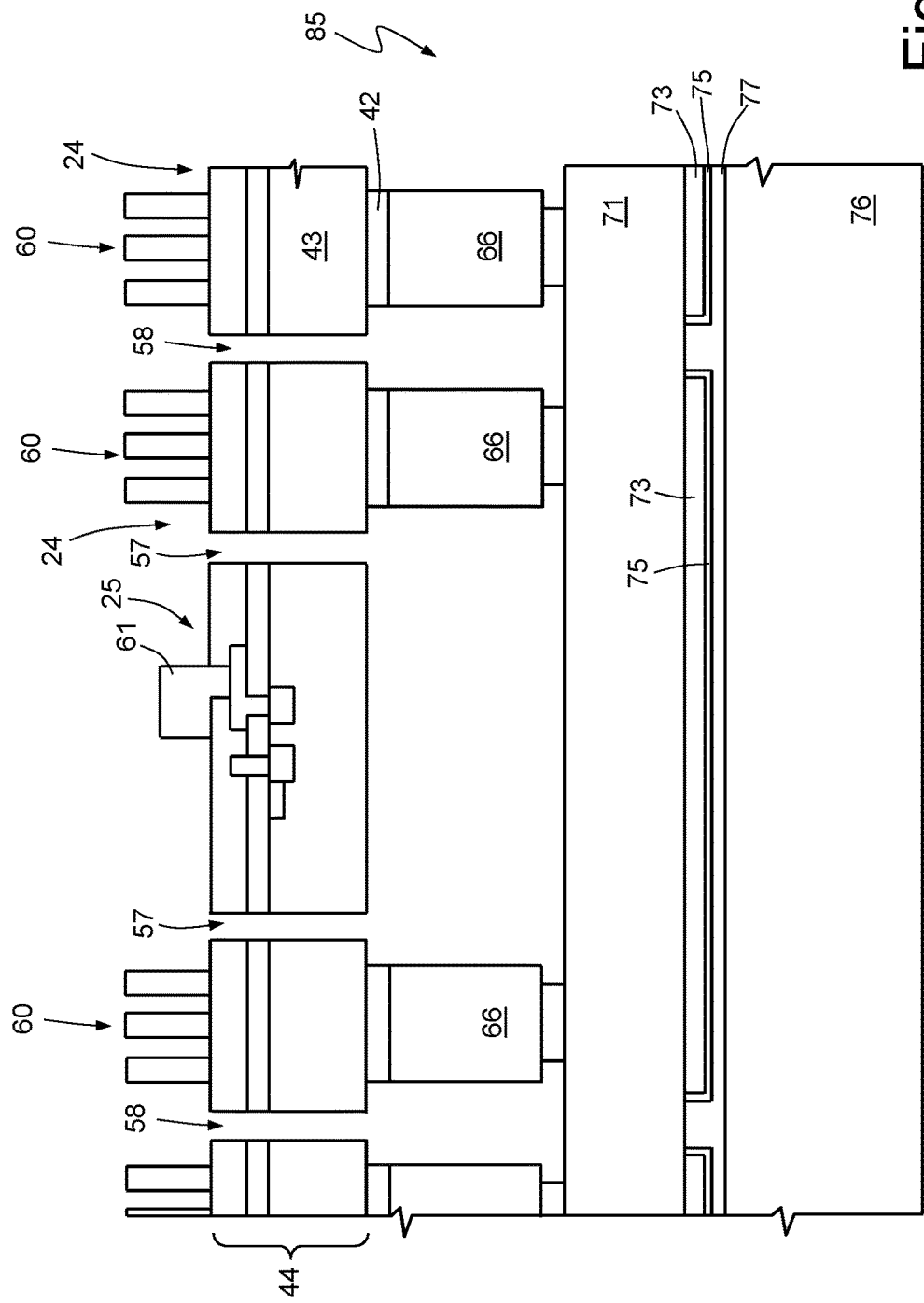
Figure 6K:
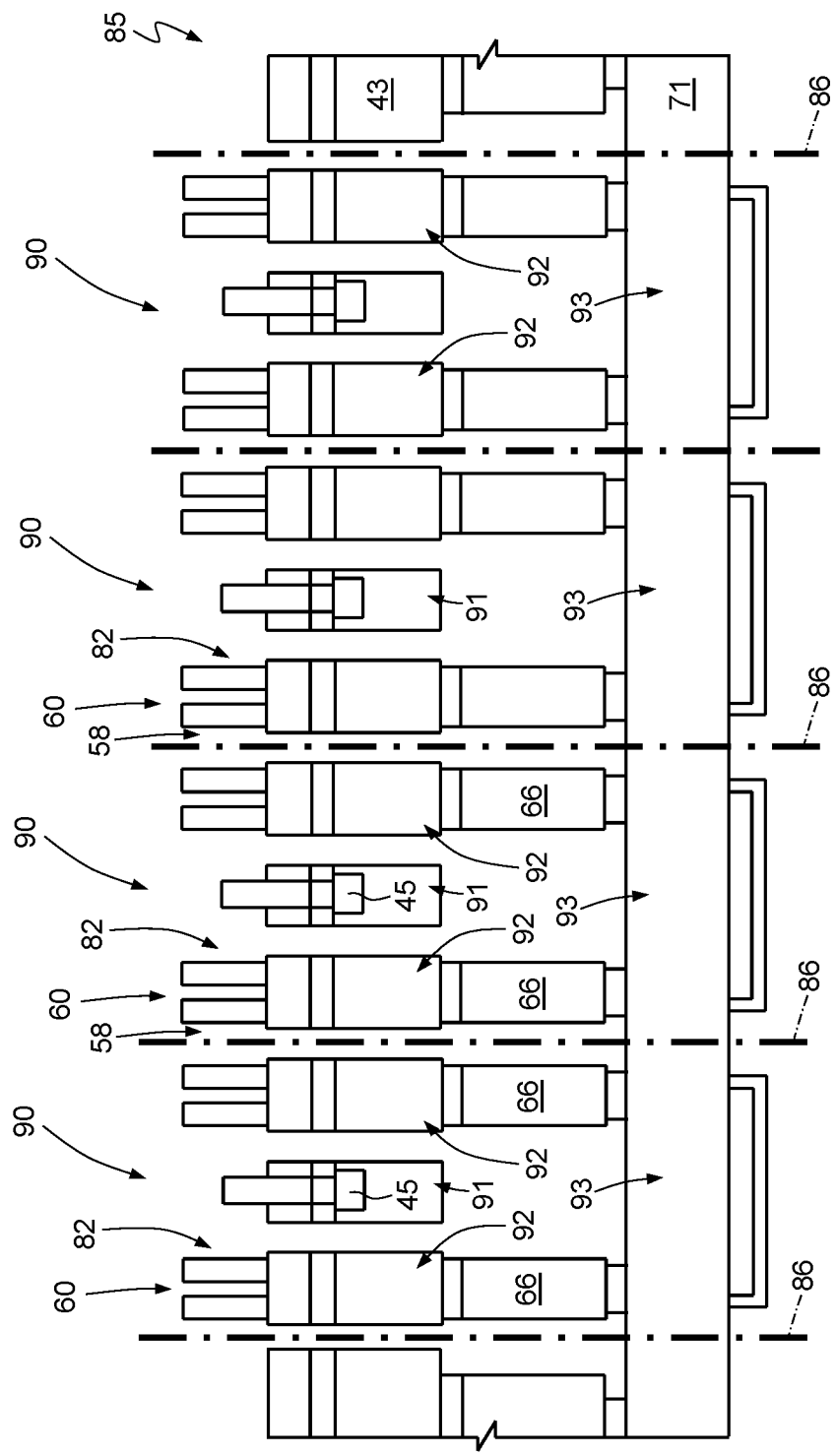

In FIG. 6J, the actuation elements of the MEMS devices are defined, and a first part of the separation step of the MEMS devices is carried out. In particular, using a mask (not shown), the second semiconductor layer 43 of the layer stack 44 is etched and removed underneath the structure definition vias 57 (thus separating the movable part 26 from the fixed part 25 of the device 20 of FIGS. 4 and 5) and the separation vias 58. Since separation of the structures of the first body 23 (FIGS. 4 and 5) of adjacent MEMS devices, formed in the first structural wafer 40, and precisely in the second semiconductor layer 43, is based upon photolithographic techniques, it may be carried out in a particularly precise way, thereby separation of the MEMS devices may be optimized and efficient, as discussed in greater detail hereinafter.

The second supporting wafer 76 is then removed by a thermal treatment at a higher temperature than while removing the first supporting wafer 63, for example at 160° C., and then performing a cleaning treatment. It should be noted that the removal of the first and second supporting wafers 63, 76 could be performed in the reverse sequence, with appropriate choice of the materials of the first and second temporary bonding layers 64, 77, in any case ensuring handling of the composite wafer 85.

Next, FIG. 6K, the composite wafer 85 is diced into individual devices 90 (singulation step), for example using a blade. Dicing, along scribe lines 86 approximately aligned to the separation vias 58, is preferably carried out from below, cutting the substrate 71 and separating the devices 90, since the overlying structures are already divided, due to selective removal of parts of the first layer 41 while defining the mirror supporting regions 66 (as explained with reference to FIG. 6E) and separating the second layer 43 (as explained with reference to FIGS. 6B and 6J).

In this way, a plurality of devices 90 is formed, shown in a simplified way and neglecting some of the regions visible in FIGS. 6A-6J, for sake of clarity. Each MEMS device 90 has a fixed region 91, accommodating for example the piezoresistors 45 (represented in a simplified manner) for the sensing structure, an actuation frame 92, surrounding the supporting region 91 and connected to the latter through elastic elements (not shown), and a tilting structure 93, formed in the substrate 71 and carrying a respective reflecting region 73. The coil 60 extends on the actuation frame 92, connected to a power supply and control circuit (not shown) and formed inside the device 90 and/or in a separate control device (not shown), for example an ASIC, in a per se known manner.

An embodiment of a process for manufacturing the MEMS device 20 of FIG. 4 with electrostatic actuation is shown in FIGS. 7A-7H and described hereinafter.

Figure 7A:
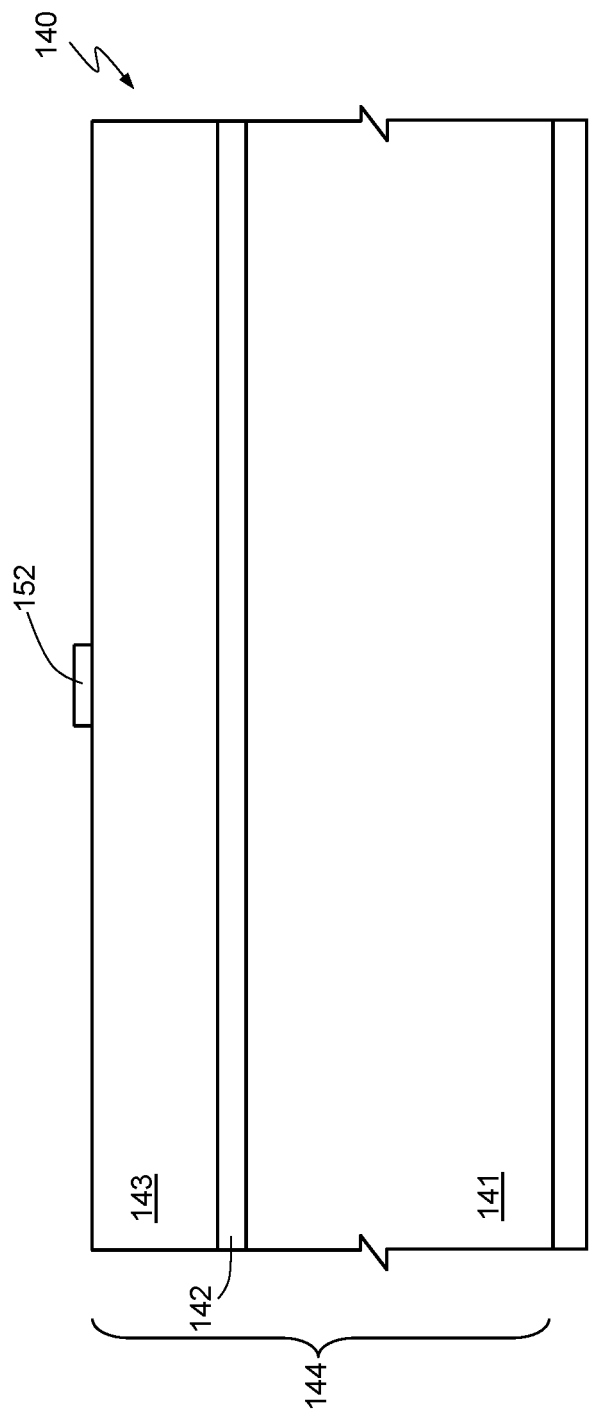
FIGS. 7A-7H are cross sections of silicon wafers in successive manufacturing steps of another embodiment of the present device.

In FIG. 7A, a first structural wafer 140 comprises a layer stack 144, similar to the layer stack 44 of FIG. 6A and including a first semiconductor layer 141, an insulating layer 142, and a second semiconductor layer 143. The layer stack 144 has a first surface 144A, formed by the second semiconductor layer 143, and a second surface 144B, formed by the first semiconductor layer 141. An oxide layer 149 may extend on the second surface 144B of the layer stack 144. The first structural wafer 140 is initially processed to form contact regions and interconnections by depositing a metal layer, masking, and defining the metal layer, to obtain contacts and contact pads 152, shown in a simplified way in FIG. 7A, for driving and sensing, on the second semiconductor layer 143.

Figure 7B:
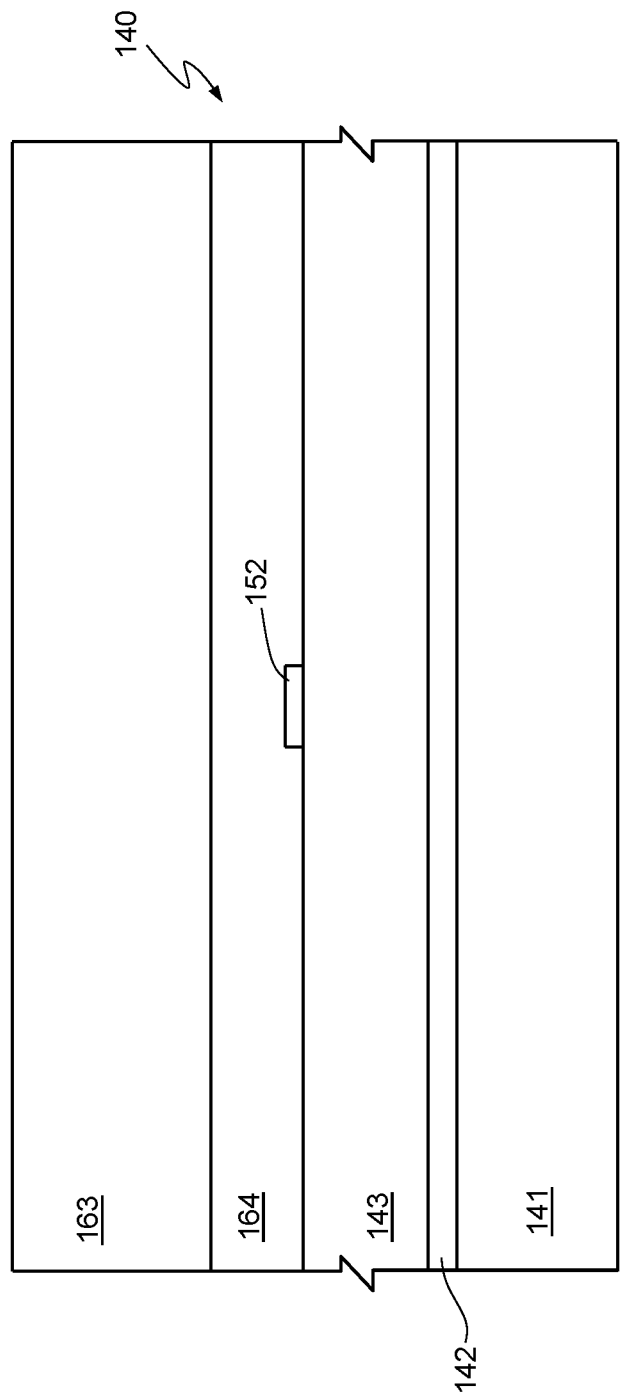

In FIG. 7B, the first layer 141 of the layer stack 144 is thinned, as described with reference to FIG. 6D. To this end, a first supporting wafer 163 is bonded to the second semiconductor layer 143 through a first temporary bonding layer 164. The first layer 141 of the layer stack 144 is then thinned, for example by grinding, so that the layer stack 144 has an overall thickness of 100-150 µm, and polished.

Figure 7C:
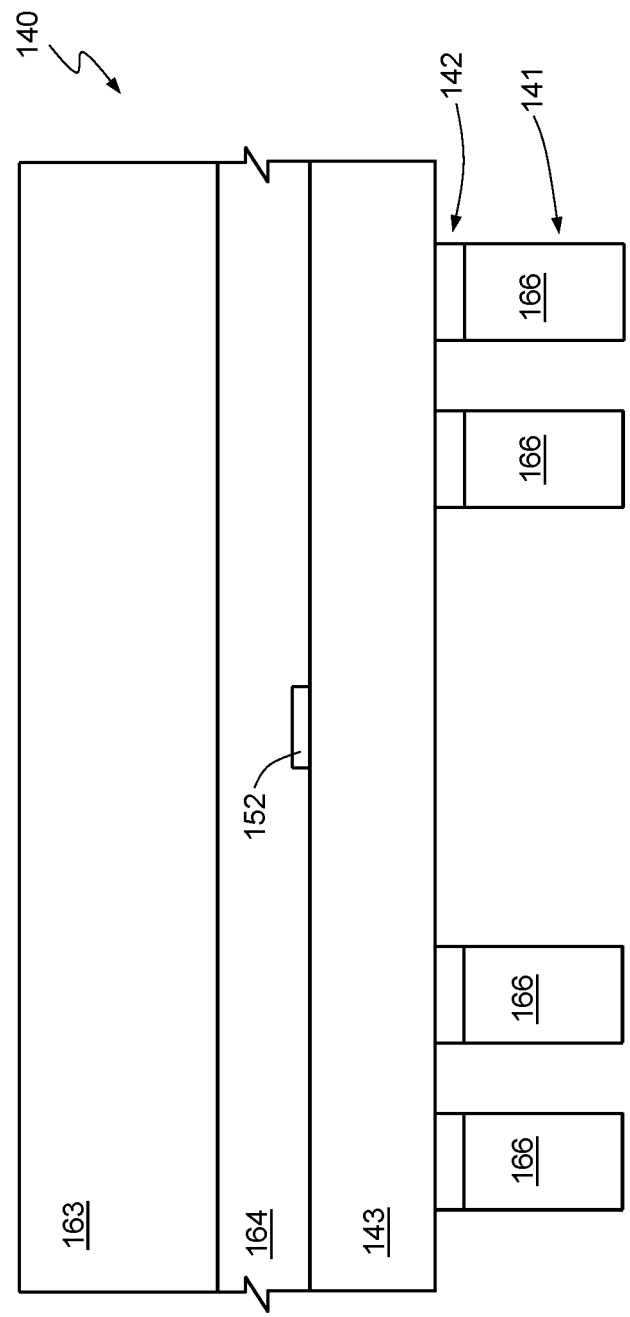

Next, FIG. 7C, the first layer 141 of the layer stack 144 and the insulating layer 142 are selectively removed by masking and etching, to form mirror supporting regions 166 having a supporting function and a movement transmission function, like the mirror supporting regions 66 of FIG. 6E.

Figure 7D:
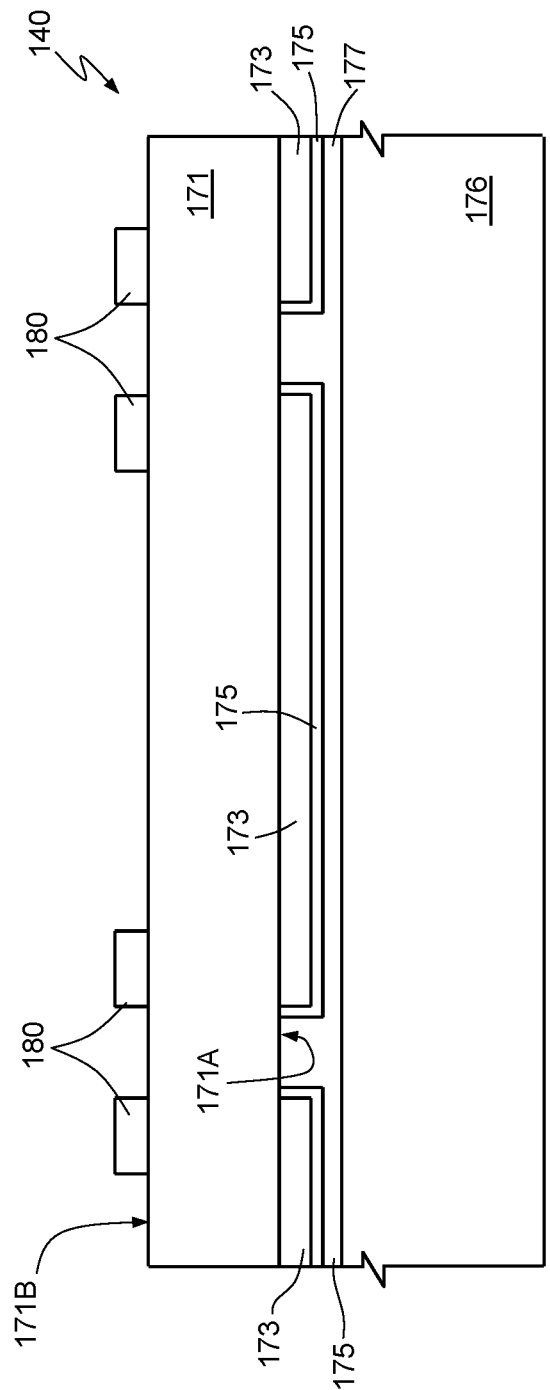

Simultaneously, before, or after the steps of FIGS. 7A-7C, a second structural wafer 170, FIG. 7D, is processed. The second structural wafer 170 is similar to the second structural wafer 70 of FIG. 6F-6G and is processed in the same way. In particular, reflecting regions 173 have been formed on a first surface 171A of a substrate 171 and a protective coating layer 175 has been formed on the reflecting regions 173. A second supporting wafer 176 has been bonded on the second structural wafer 170 using a second temporary bonding layer 177 applied on the first surface 171A of the substrate 171 and on the protective layer 175. The substrate 171 has been thinned, and adhesive regions 180 have been printed on a second surface 171B of the substrate 171.

Figure 7E:
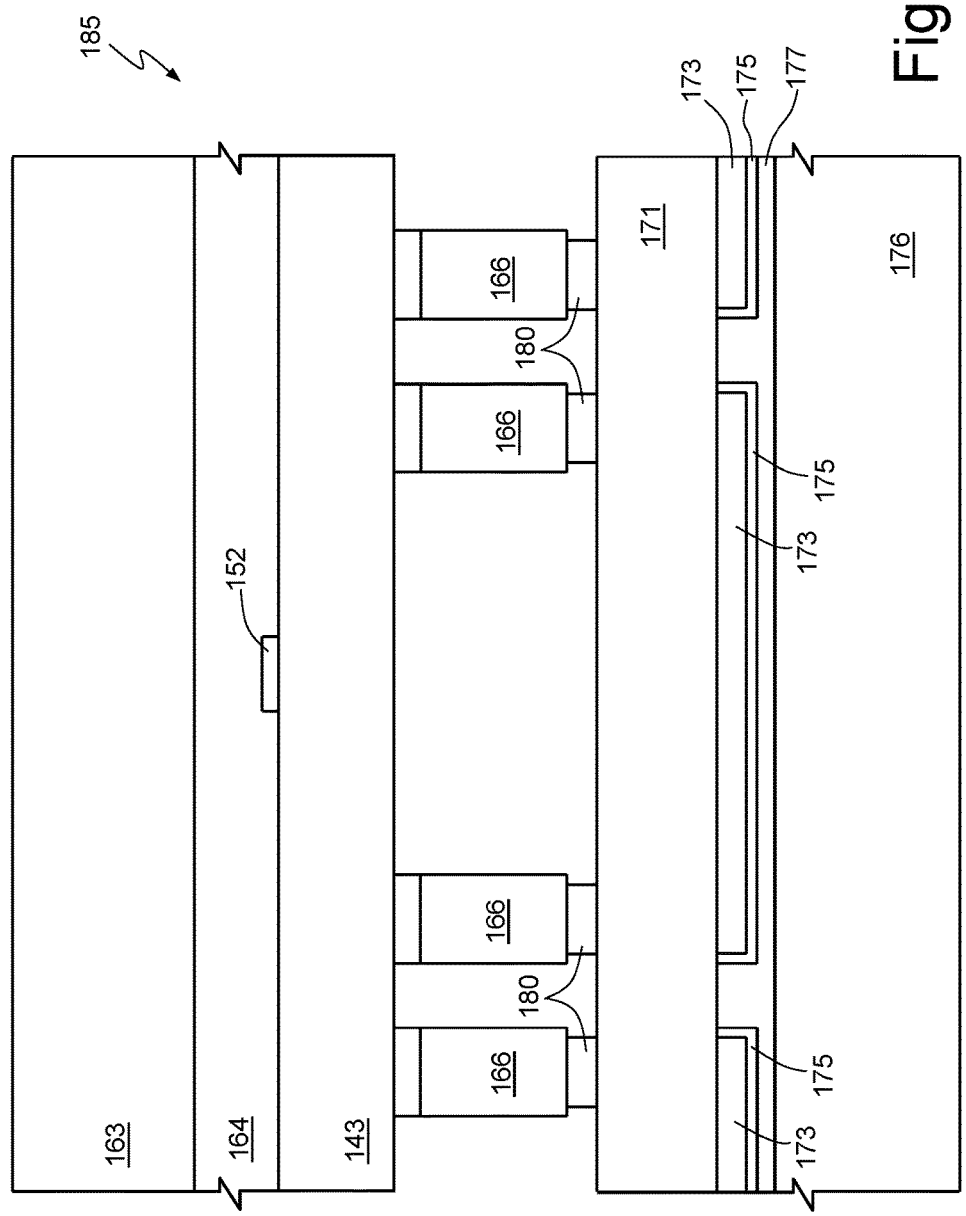

Then, FIG. 7E, and as in FIG. 6H, the first structural wafer 140 and the second structural wafer 170 are bonded together by the adhesive regions 180. Also here, the adhesive regions 180 are approximately aligned to the mirror supporting regions 166 and the latter is bonded to the substrate 171. A composite wafer 185 is thus formed.

Figure 7F:
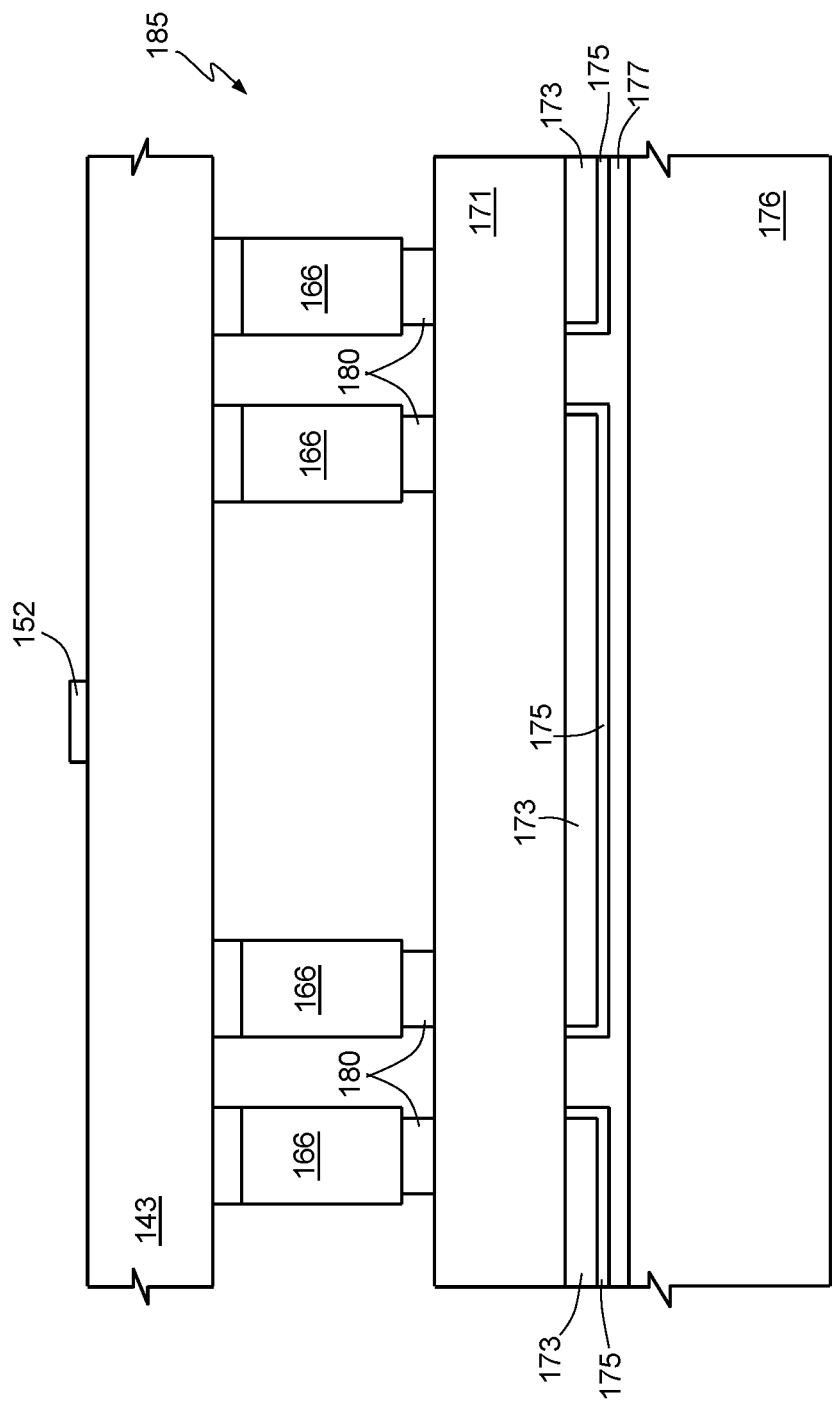

In FIG. 7F, the first supporting wafer 163 is detached by a thermal treatment at a medium temperature, for example at 140° C., and then cleaning.

Figure 7G:
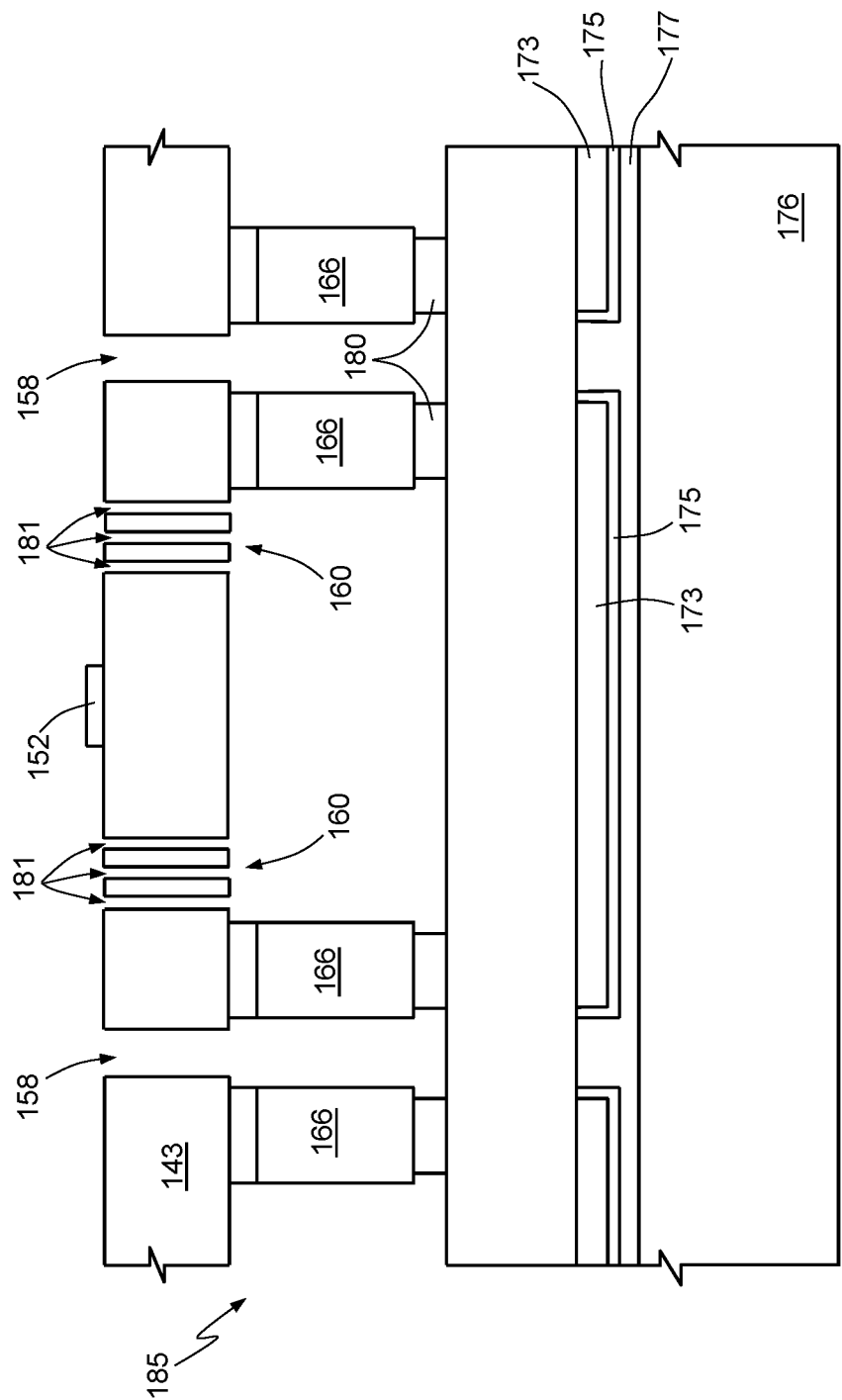
Figure 7H:
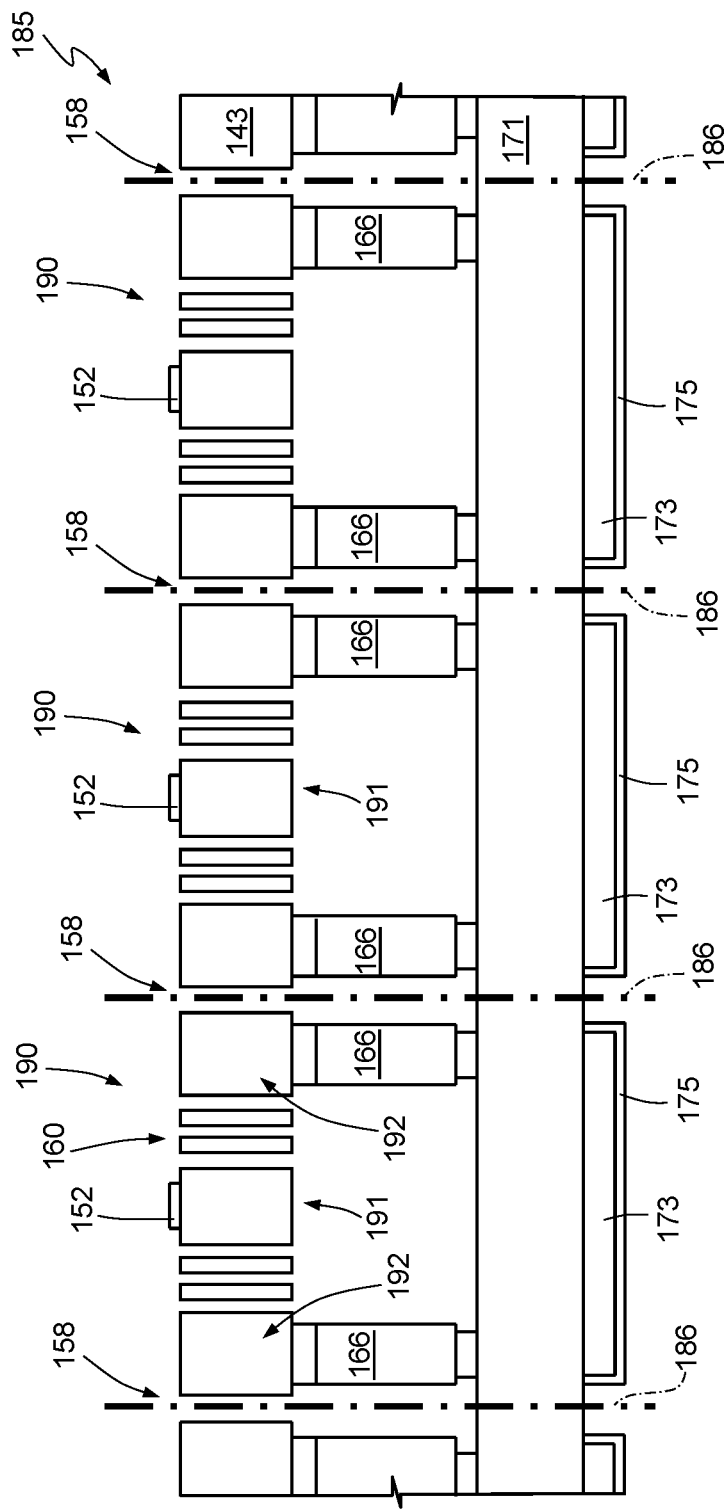

Next, FIG. 7G, the electrostatic actuation elements of the MEMS devices (rotors) are defined, and a first part of the separation of the MEMS devices is carried out. In particular, using a mask (not shown), the second semiconductor layer 143 of the layer stack 144 is etched and removed so as to form trenches 181 that separate and define the movable parts 24, the elastic elements 27, FIGS. 4 and 5, and elements of the actuation structure, designated as a whole by 160, in a per se known manner. The actuation structure 160 may be of any known type, for example of a comb drive structure type. In the same step, separation through vias 158 are formed, similar to the separation vias 58 of FIG. 6J.

Next, the second supporting wafer 176 is detached, by performing a thermal treatment at a higher temperature than during detachment of the first supporting wafer 163 and then cleaning.

Next, FIG. 7H, the composite wafer 185 is cut into individual devices 190 (singulation step), for example using a blade. Dicing, along scribe lines 186, is preferably carried out from below, cutting the substrate 171 approximately aligned with the separation through vias 158 and separating the devices 190, since the overlying structures are already divided, due to the separation of the second layer 143 (as explained with reference to FIG. 7G and as discussed with reference to FIG. 6K).

In this way, a plurality of devices 190 is formed, shown in a simplified way, for sake of clarity. Each MEMS device 190 has a fixed region 191, carrying, for example, the contacts 152 (represented in a simplified manner), an actuation frame 192, surrounding the fixed region 191 and connected to the latter through elastic elements (not shown), and a tilting structure 193, formed in the substrate 171 and carrying a respective reflecting region 173. The contacts 152 enable electrical connection of the elements of the actuation structure 160 (here also forming sensing elements) with a driving and control circuit (not shown), provided in the device 190 and/or in a separate control device (not shown), for example an ASIC, in a per se known manner.

An embodiment of a process for manufacturing the MEMS device 20 with a piezoelectric actuation is shown in FIGS. 8A-8K and described hereinafter. It should be noted that these figures are cross sections taken along different lines of section, indicated in FIG. 9, which is a schematic top plan view of the first body 23 (with the structures formed in the first wafer), as described in detail each time.

Figure 8A:
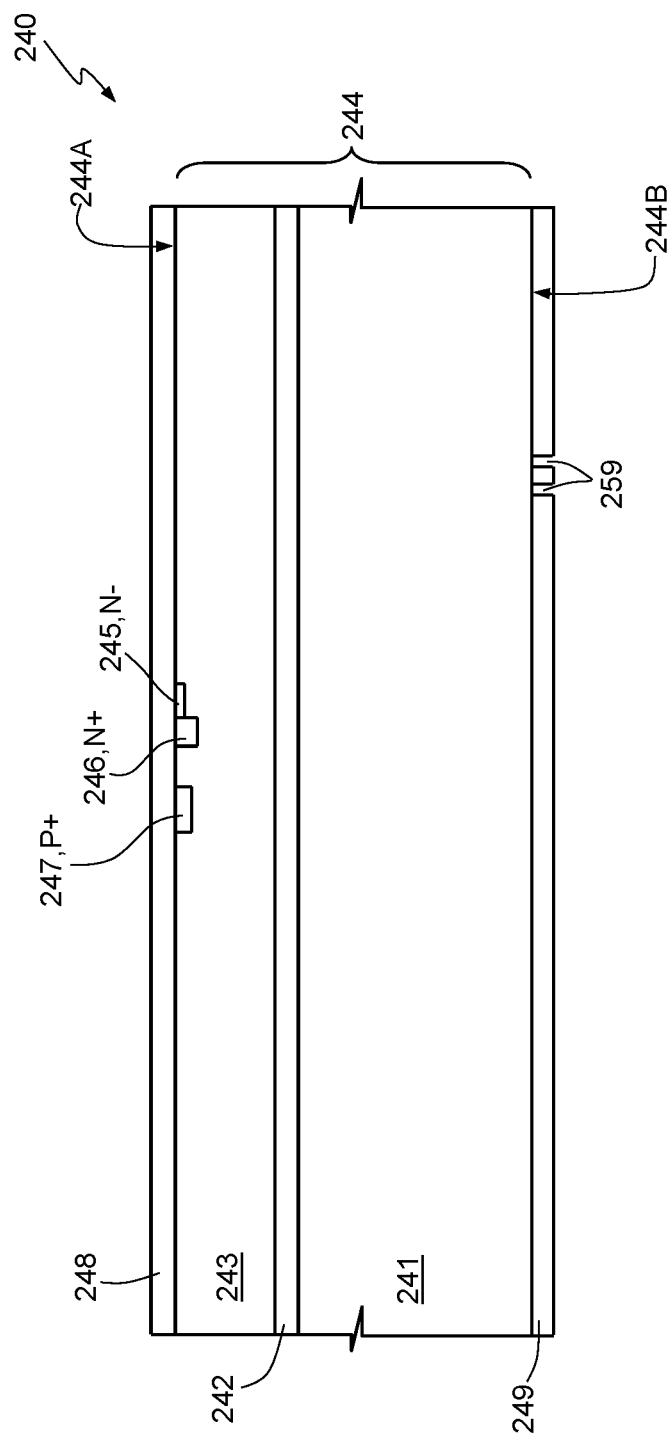
Figure 9:
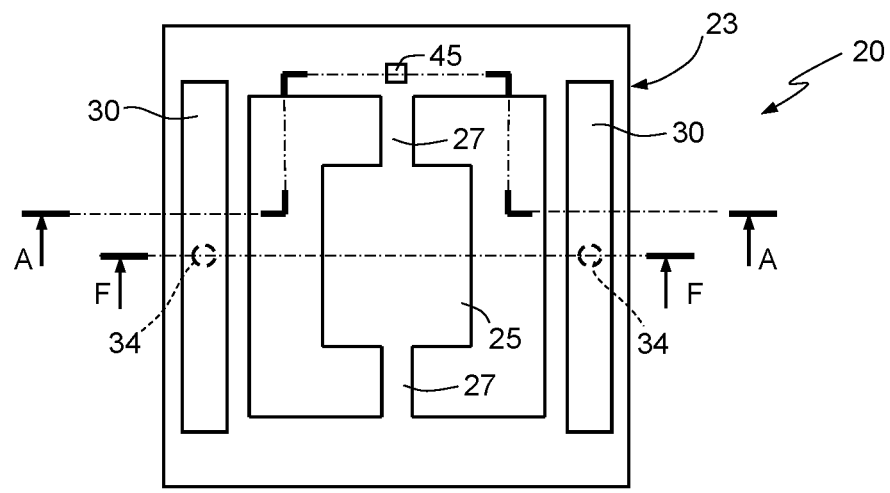
FIG. 9 is a top plan view of a first body of the present MEMS device.

In FIG. 8A, taken along section line A-A of FIG. 9, a first structural wafer 240 comprises a layer stack 244 similar to the layer stack 44 of FIG. 6A and including a first semiconductor layer 241, an insulating layer 242, and a second semiconductor layer 243. The layer stack 244 has a first surface 244A, formed by the second semiconductor layer 243, and a second surface 244B, formed by the first semiconductor layer 241. An oxide layer 249 extends over the second surface 244B of the layer stack 244. Reference marks 259 are formed in the oxide layer 249 and sensing structures, as described with reference to FIG. 6A are formed in the first structural wafer 240. In particular, piezoresistors 245, piezoresistor contact regions 246 and substrate contact regions 247 are formed in the second semiconductor layer 243, as described with reference to FIG. 6A a premetal dielectric layer 248 is deposited on the first surface 244A.

Figure 8B:
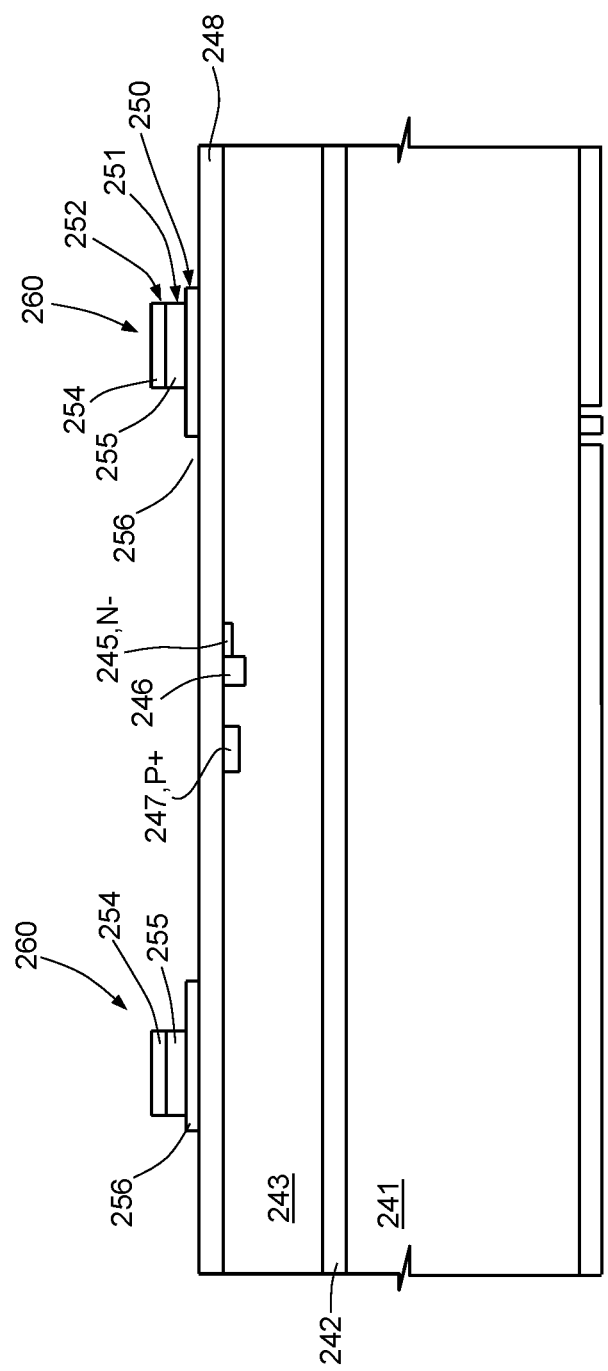

Next, FIG. 8B, also taken along section line A-A of FIG. 9, piezoelectric actuation elements 260 and corresponding electrical connections are formed. To this end, a bottom electrode layer 250, of a metal such as titanium (Ti) or platinum (Pt), a piezoelectric layer 251, for example a ceramic with a base of lead titanate zirconate (PZT), and a top electrode layer 252, for example ruthenium (Ru), are deposited in sequence. Then, via a first lithographic definition, the top electrode layer 252 and the piezoelectric layer 251 are etched and defined to form top electrodes 254 and piezoelectric regions 255. The bottom electrode layer 253 is etched and defined to form bottom electrodes 255, through a second lithographic definition.

Figure 8C:
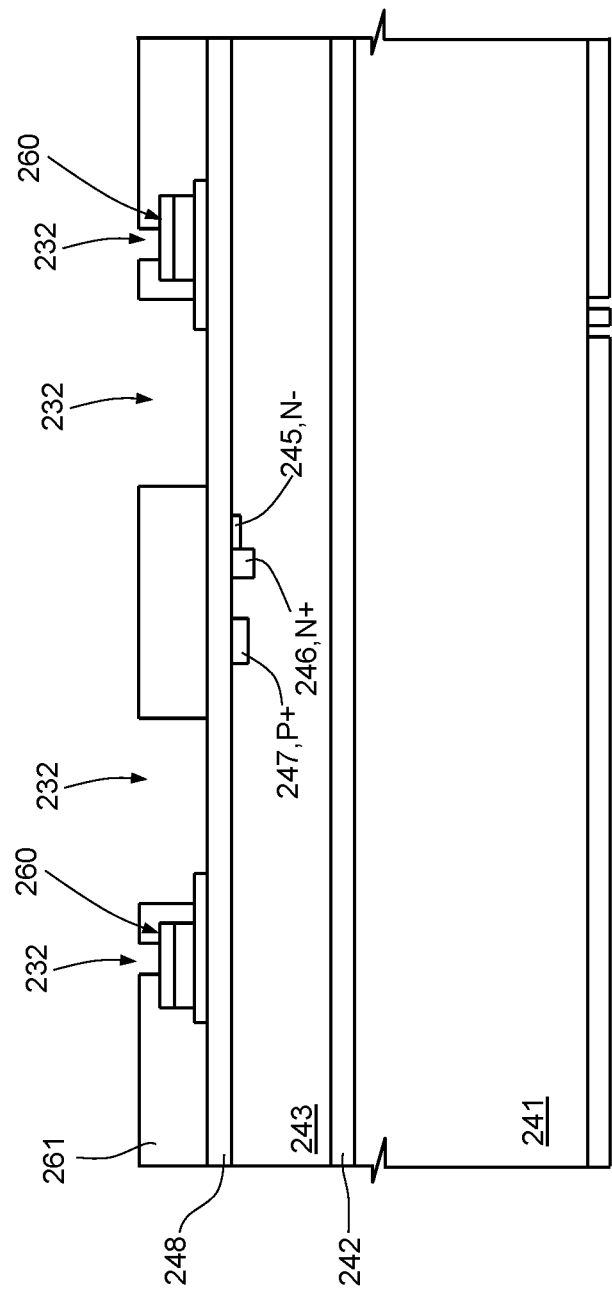

Next, FIG. 8C, also taken along section line A-A of FIG. 9, a structure for protection of the piezoelectric actuation elements 260 is formed. To this end, a passivation layer 261, for example of silicon nitride, is deposited and the passivation layer 261 is opened by masking and etching, to form electrode vias 232 reaching the top and the bottom electrodes 253, 254 of the piezoelectric actuation structures 260.

Figure 8D:
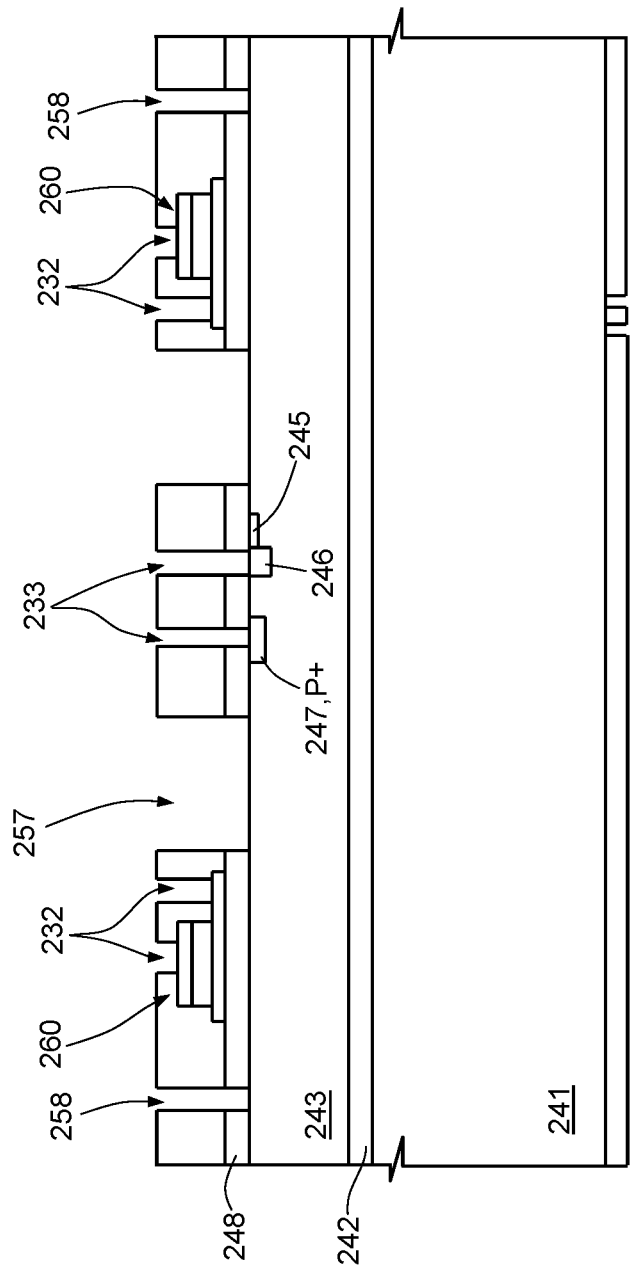

Then, FIG. 8D, also taken along section line A-A of FIG. 9, contact vias 233, structure definition vias 257, and separation vias 258 are formed. The contact vias 233 extend in the passivation layer 261 as far as the piezoresistor contact regions 246 and the substrate contact regions 247. The structure definition vias 257 and the separation vias 258 extend in the passivation layer 261 as far as the second semiconductor layer 243. As for the definition vias 57 and 157, the definition vias 257 are subsequently used for defining the actuation elements in the first structural wafer 240, and thus their geometry follows that of the actuation elements to be formed.

Figure 8E:
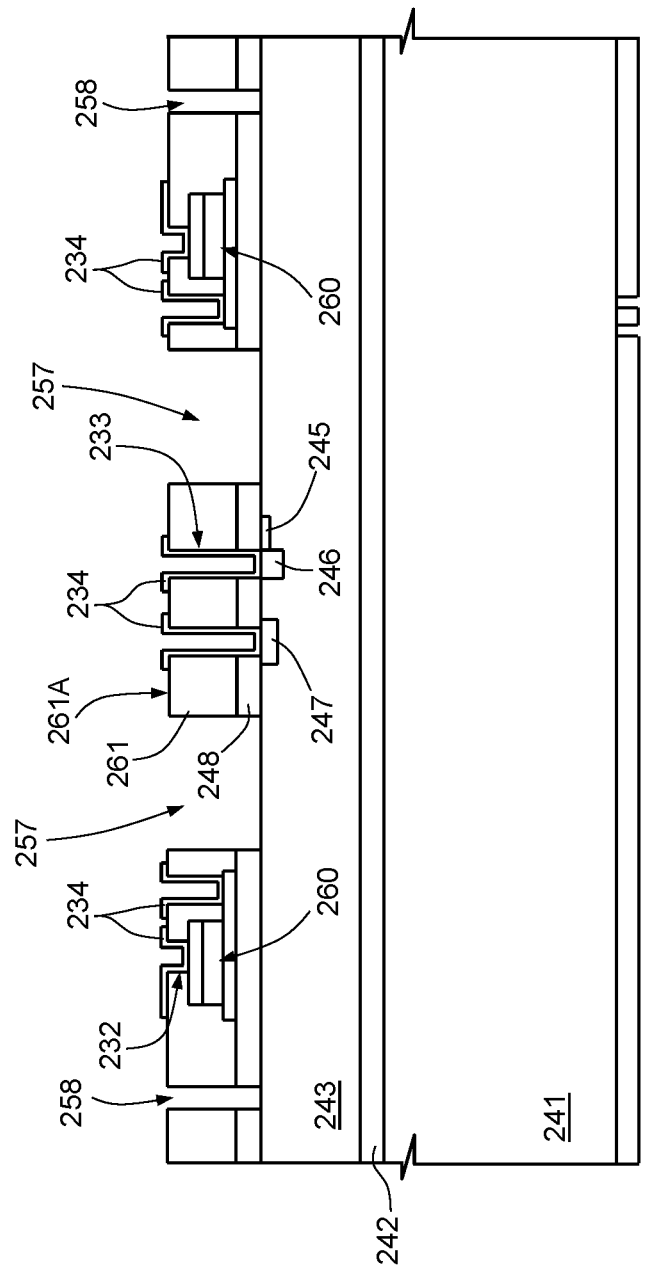

Next, FIG. 8E, also taken along section line A-A of FIG. 9, a metal layer (for example aluminum) is deposited and lithographically defined to form contact regions, interconnections, and contact pads. In particular, actuator contacts 234 are formed in the electrode vias 232 and the contact vias 233, and interconnections and contact pads 265 are formed on the surface 261A of the passivation layer 261.

Then, FIG. 8F, taken along cross-section line F-F of FIG. 9, and like FIGS. 6D, 6E, 7B, 7C, the first layer 241 of the layer stack 244 is thinned and patterned. To this end, a first supporting wafer 263 is bonded to the passivation layer 261 through a first temporary bonding layer 264, the first layer 241 is thinned and polished and selectively removed together with the insulating layer 242, to form mirror supporting regions 266.

Simultaneously, before, or after the steps of FIGS. 8A-8F, a second structural wafer 270 is processed, FIG. 8G, taken along section line F-F of FIG. 9. The second structural wafer 270 is similar to the second structural wafer 170 of FIG. 7D and is processed in the same way. In particular, reflecting regions 273 have been formed on a first surface 271A of a substrate 271. A protective coating layer 275 has been formed. A second supporting wafer 276 has been bonded on the second structural wafer 270 using a second temporary bonding layer 277. The substrate 271 has been thinned, and adhesive regions 280 have been printed on a second surface 271B of the substrate.

Figure 8H:
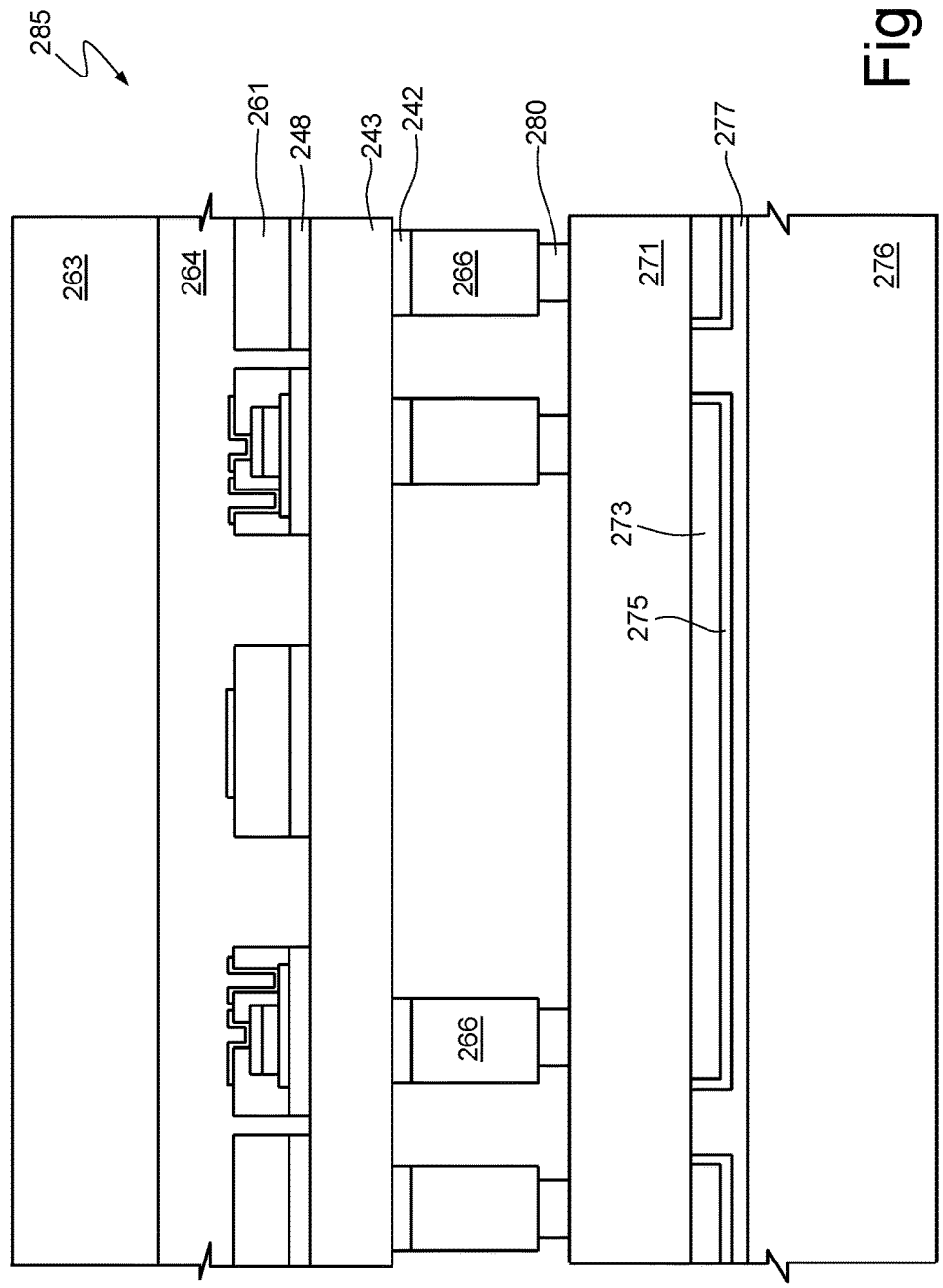

Next, FIG. 8H, taken along section line F-F of FIG. 9, and like FIGS. 7H and 7E, the first and the second structural wafers 240, 270 are bonded together by the adhesive regions 280. Also here, the adhesive regions 280 are arranged aligned to the mirror supporting regions 266 and the latter is bonded to the substrate 271. A composite wafer 285 is thus formed.

Figure 8I:
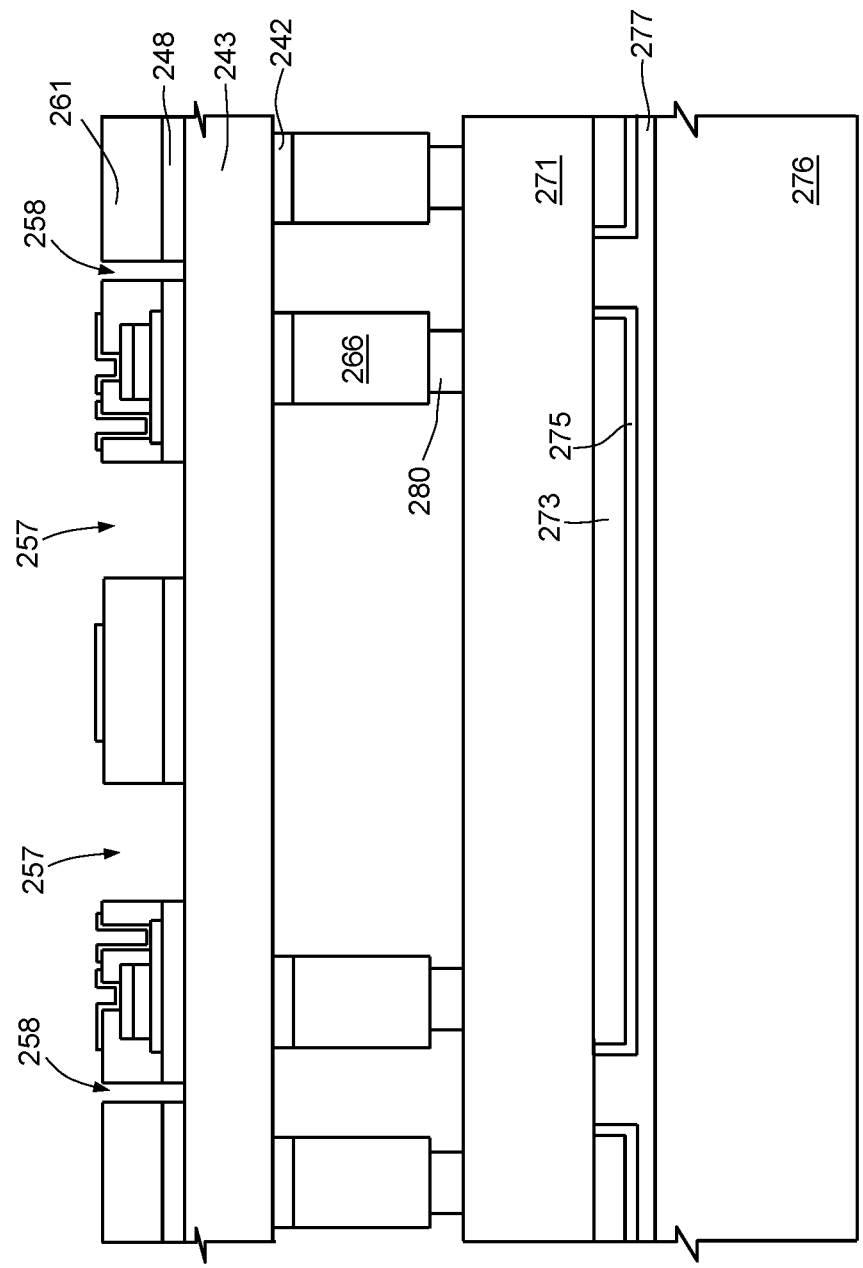

In FIG. 8I, taken along section line F-F of FIG. 9, the first supporting wafer 63 is detached by a thermal treatment at a medium temperature and then cleaning.

Figure 8J:
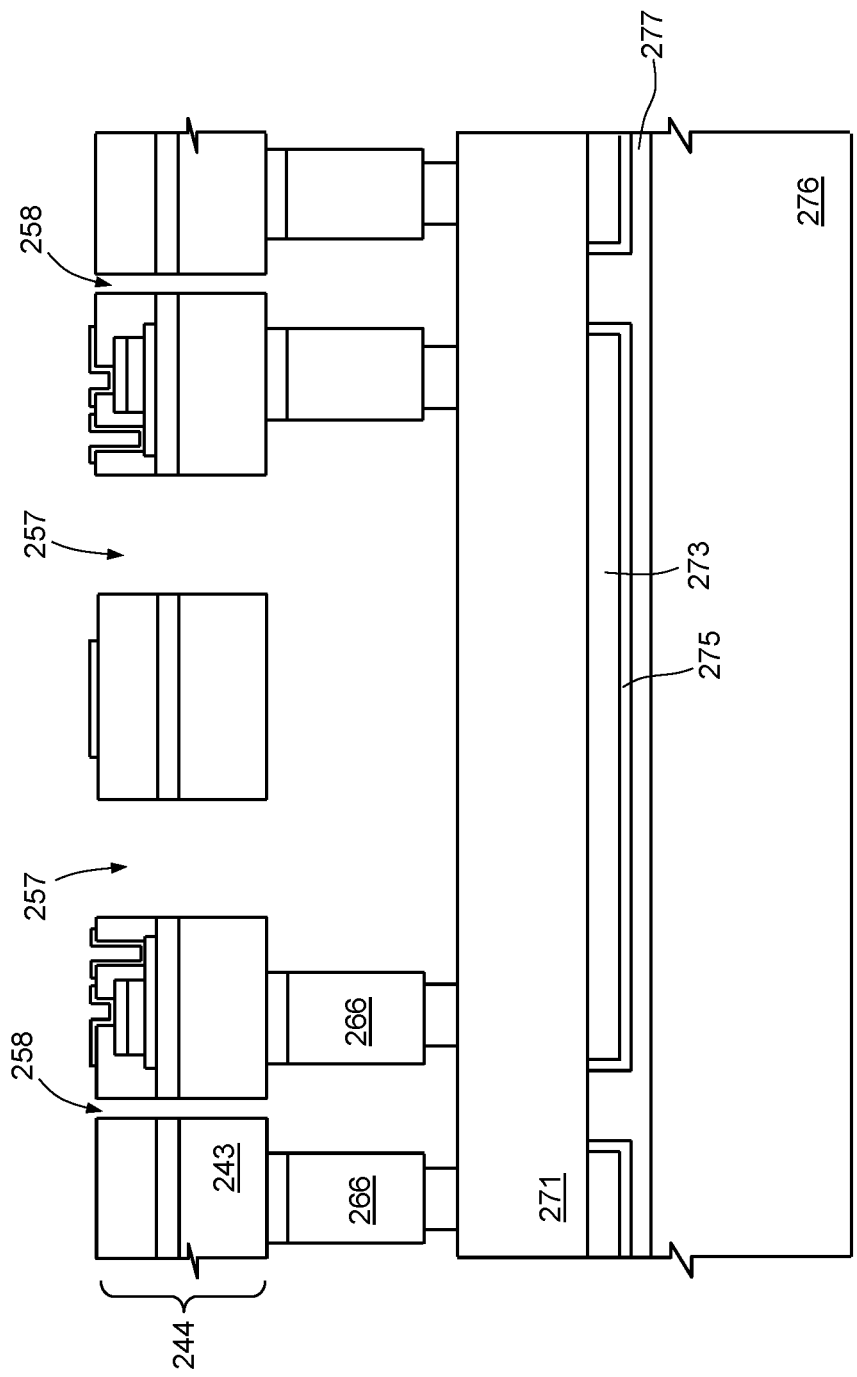
Figure 8K:
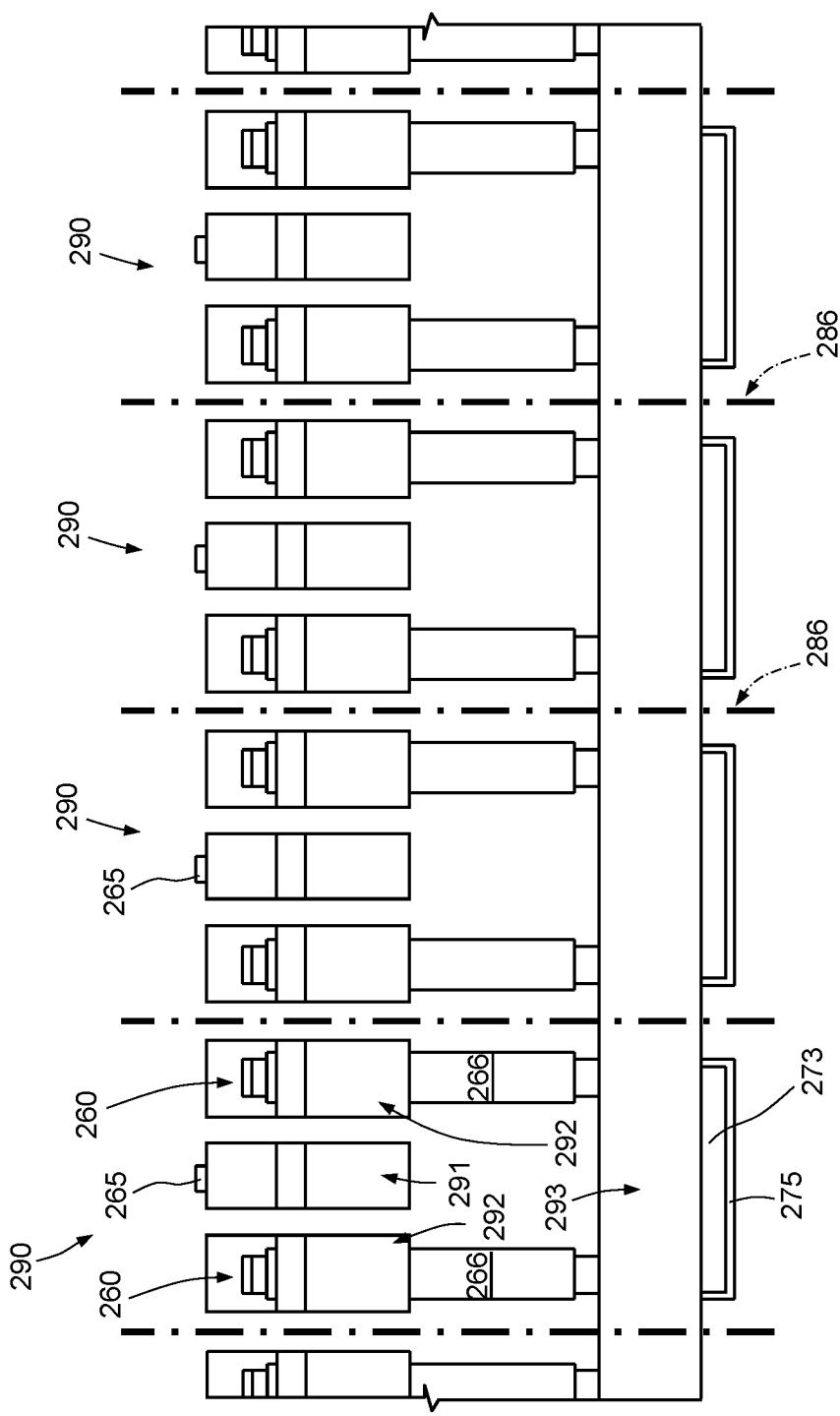

In FIG. 8J, taken along section line F-F of FIG. 9, the actuation elements of the MEMS devices (rotors) are defined, and a first part of the separation of the MEMS devices is carried out, as described with reference to FIG. 6J.

In particular, the second semiconductor layer 243 of the layer stack 244 is etched and removed under the structure definition openings 257 (thus separating the movable part 26 from the fixed part 25, FIGS. 4 and 5) and under the separation vias 258.

Then, the second supporting wafer 276 is detached by thermal treatment at a higher temperature than detachment of the first supporting wafer 263 and then cleaning. Next, FIG. 8K, taken along section line F-F of FIG. 9, the composite wafer 285 is diced into individual devices 290 (singulation step), for example using a blade. Dicing, along scribe lines 286, is preferably carried out from below by cutting the substrate 271 approximately aligned to the separation through vias 258, thereby separating the devices 290, since the overlying structures are already divided, due to the separation of the second layer 243 (as explained with reference to FIG. 8J).

In this way, a plurality of devices 290 is formed, shown in a simplified way and neglecting the piezoresistors 245, the piezoresistor contact regions 246, the substrate contact regions 247, and the actuator contacts 234, for sake of clarity. Each MEMS device 290 has a fixed region 291, an actuation frame 292, surrounding the fixed region 291 and connected to the latter through elastic elements (not shown), and a tilting structure 293, formed in the substrate 271 and carrying a respective reflecting region 273. The piezoelectric actuation elements 260 extend over the actuation frame 292 and are connected to a driving and control circuit (not shown), provided in the device 290 and/or in a separate control device (not shown), for example an ASIC, in a per se known manner.

In this way, a MEMS device of reduced dimensions may be formed, since the actuation and sensing elements may be formed vertically above and below the reflecting surface, in the area thereof (in top plan view), and do not project laterally therefrom. It is thus possible to form reflecting surfaces with maximum area, with a process comprising typical MEMS manufacturing steps, thus easily controlled and implemented in a relatively inexpensive way.

Formation and fixing of the fixed and mobile structures at wafer level, thus in a front end step, enables the dimensional parameters to be well controlled and the tolerance requirements to be met more easily. A further reduction in the total dimensions is thus obtained, thus providing a particularly compact structure.

Manufacturing at a wafer level provides a good mechanical yield, with optimal thicknesses and reduced brittleness.

The micro-electro-mechanical device 20; 90; 190; 290 may be used in a picoprojector 301 designed to be functionally coupled to a portable electronic apparatus 300, as illustrated hereinafter with reference to FIGS. 10-12.

Figure 10:
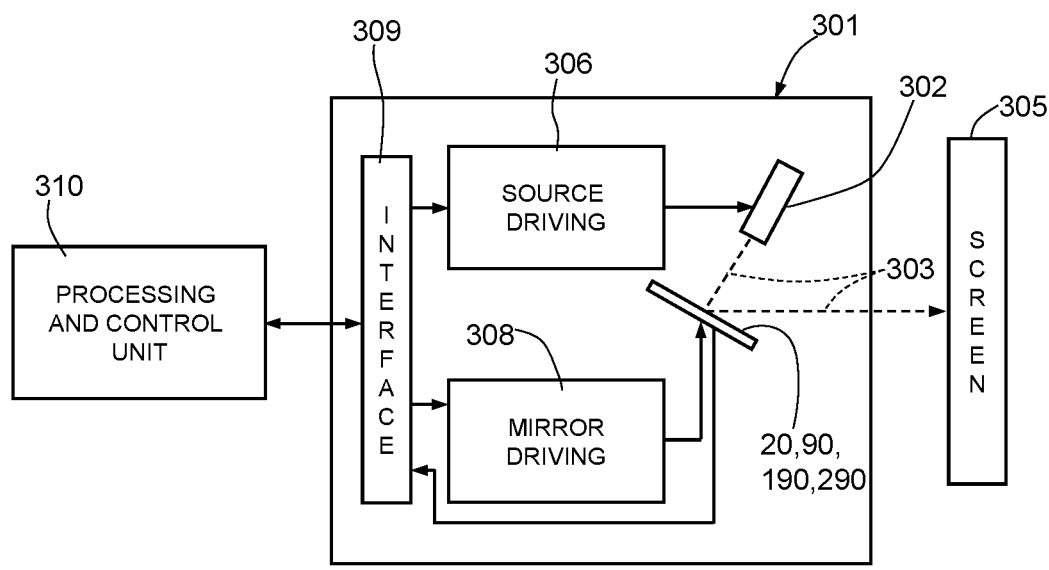
FIG. 10 is a block diagram of a picoprojector that uses the present MEMS device.
Figure 11:
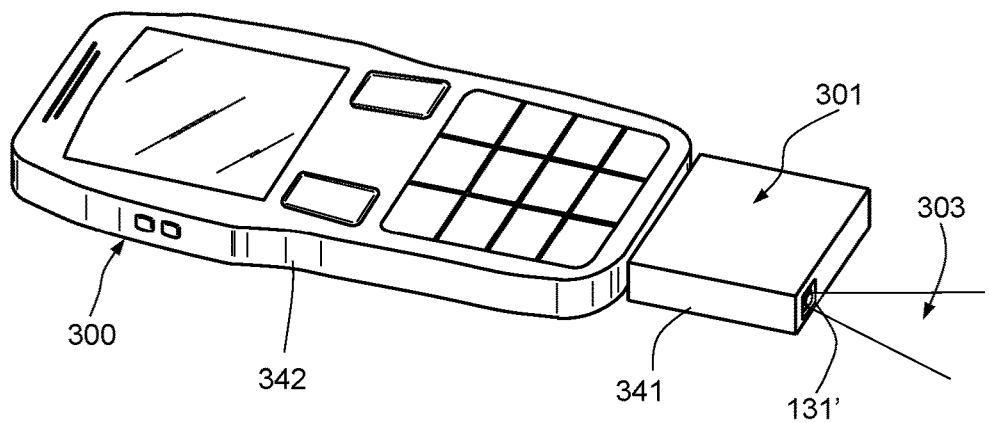
FIGS. 11 and 12 show different couplings between the picoprojector of FIG. 9 and a portable electronic apparatus.
Figure 12:
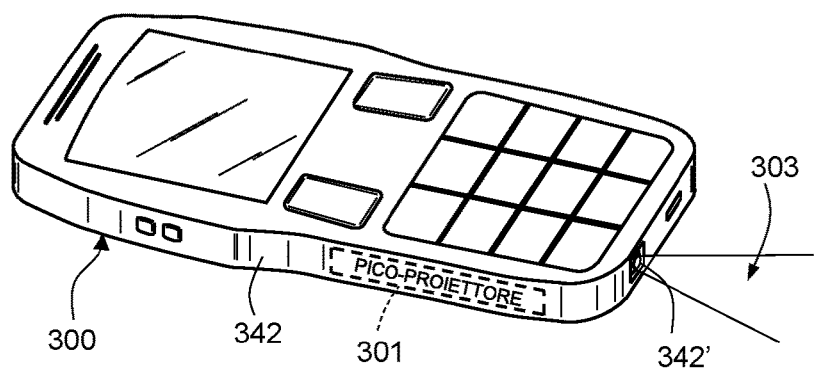

In detail, the picoprojector 301 of FIG. 10 comprises a light source 302, for example of a laser type, designed to generate a light beam 303; the micro-electro-mechanical device 20, 90, 190, 290, designed to receive the light beam 303 and to direct it toward a screen or a display surface 305 (external and arranged at a distance from the picoprojector 301); a first driving circuit 306, designed to supply appropriate control signals to the light source 302, for generating the light beam 303 as a function of an image to be projected; a second driving circuit 308, designed to supply driving signals for rotating the tilting structure 24; 93; 193; 293, FIGS. 4-5, 6K, 7H, 8K) of the micro-electro-mechanical device 20; 90; 190; 290; and a communication interface 309, designed to receive light information on the image to be generated, for example as a pixel array, from an external control unit 310, for example included in the portable apparatus 300, FIGS. 11 and 12. The light information received at the input to drive the light source 302.

Further, the control unit 310 may comprise a unit for controlling the angular position of the mirror of the micro-electro-mechanical device 20; 90; 190; 290. To this end, the control unit 310 may receive the signals generated by the sensing structure 31, 45, 245, FIGS. 4-5, 8K through the interface 309 and control accordingly the second driving circuit 308.

The picoprojector 301 may be formed as separate and standalone accessory with respect to an associated portable electronic apparatus 300, for example a cellphone or smartphone, as shown in FIG. 11. In this case, the picoprojector 301 is coupled to the portable electronic apparatus 300 by appropriate electrical and mechanical connection elements (not illustrated in detail). Here, the picoprojector 301 has an own housing 341, with at least one portion 341' transparent to the light beam 303 coming from the microelectronic device 20, 90, 190, 290, the housing 341 of the picoprojector 301 being releasably coupled to a respective case 342 of the portable electronic apparatus 300.

Alternatively, as illustrated in FIG. 12, the picoprojector 301 may be integrated within the portable electronic apparatus 300 and be arranged within the case 342 of the portable electronic apparatus 300. In this case, the portable electronic apparatus 300 has a respective portion 342' transparent to the light beam 303 coming from the micro-electro-mechanical device 20; 90; 190; 290. The picoprojector 301 is in this case coupled, for example, to a printed circuit board (PCB) in the case 342 of the portable electronic apparatus 300.

Finally, it is clear that modifications and variations may be made to the device and to the manufacturing process described and illustrated herein, without thereby departing from the scope of the present invention, as defined in the attached claims. For example, the various described embodiments may be combined to provide further solutions.

For instance, even though the presented solutions has a fixed structure surrounded by a movable structure configured like a frame, the arrangement could be dual. The frame element could be defined by a non-closed shape, for example a C-shape or some other suitable shape.

The described solution may be applied also to other structures, for example to devices having a part that may be moved by translation.

In the embodiment of FIGS. 5A-5K, the definition and separation vias 58 may be formed after bonding the first structural wafer 40 to the second structural wafer 70, and after removing the first supporting wafer 63.

The invention claimed is:

1. A micro-electro-mechanical device, comprising:
   a first monolithic body including semiconductor material; and
   a second monolithic body including semiconductor material, overlying the first monolithic body;
   wherein the first monolithic body comprises a fixed part, a movable part, and elastic elements elastically coupling the movable part and the fixed part, said movable part carrying actuation elements configured to control a relative movement of the movable part with respect to the fixed part; and
   wherein the first monolithic body includes projections that extend from the movable part and are bonded to the second monolithic body.

2. The micro-electro-mechanical device according to claim 1, wherein the movable part and the second monolithic body form an orientable structure rotatable around a rotation axis.

3. The micro-electro-mechanical device according to claim 2, wherein the second monolithic body carries a reflecting surface.

4. The micro-electro-mechanical device according to claim 1, further including a sensing structure associated with the fixed part of the first monolithic body.

5. The micro-electro-mechanical device according to claim 1, wherein the actuation elements are selected from the group consisting of: magnetic actuation elements, electrostatic actuation elements, and piezoelectric actuation elements.

6. A process for manufacturing a micro-electro-mechanical device, comprising:
forming projections extending from a first portion of a first monolithic body comprising semiconductor material;
superimposing a second monolithic body comprising semiconductor material on the first monolithic body;
bonding the projections of the first monolithic body to the second monolithic body and forming a composite body;
forming actuation elements inside or on the first portion of the first monolithic body;
defining the first monolithic body to form a fixed part, a movable part, and elastic elements, the movable part carrying the actuation elements and having the projections, and the elastic elements coupling the movable part to the fixed part.

7. The process according to claim 6, comprising, after bonding the projections to the second monolithic body, cutting the composite body into a plurality of devices.

8. The process according to claim 6, comprising, prior to forming projections, bonding the first monolithic body to a first supporting wafer through a first temporary bonding layer.

9. The process according to claim 8, wherein forming projections comprises selectively removing portions of the first monolithic body.

10. The process according to claim 9, wherein the first monolithic body comprises a layer stack including a first semiconductor layer, an insulating layer, and a second semiconductor layer;
wherein bonding the first monolithic body to a first supporting wafer comprises bonding the second semiconductor layer to the first supporting wafer and thinning the first semiconductor layer; and
wherein forming projections comprises selectively removing portions of the thinned first semiconductor layer.

11. The process according to claim 8, further comprising, before or after forming the composite body, forming a cover layer on the first monolithic body and forming structure definition vias and separation vias in the covering layer,
the process further comprising, after forming a composite body:
removing the first supporting wafer;
removing first portions of the first monolithic body underneath the structure definition vias;
removing second portions of the first monolithic body underneath the separation vias; and
cutting the second monolithic body aligned to the separation vias.

12. The process according to claim 8, further comprising, after forming the composite body:
removing the first supporting wafer;
selectively removing first portions of the first monolithic body to form the movable part, the fixed part, and the elastic elements;
selectively removing second portions of the first monolithic body to form separation vias; and
cutting the second monolithic body aligned to the separation vias.

13. The process according to claim 8, further comprising, before bonding the first monolithic body to a first supporting wafer and before defining the first monolithic body, forming sensing elements in or on a second portion of the first monolithic body, the second portion forming the fixed part of the first monolithic body, after defining the first monolithic body.

14. The process according to claim 6, further comprising, prior to bonding the projections to the second monolithic body, bonding the second monolithic body to a second supporting wafer through a second temporary bonding layer.

15. The process according to claim 14, further comprising, before bonding the second monolithic body to a second supporting wafer, forming reflecting surfaces on a first surface of the second monolithic body, wherein bonding the second monolithic body to a second supporting wafer comprises bonding the first surface of the second monolithic body to the second supporting wafer.

16. The process according to claim 15, further comprising, after bonding the second monolithic body to a second supporting wafer and before bonding the projections of the first monolithic body to the second monolithic body, thinning the second monolithic body from a second surface of the second monolithic body.

17. The process according to claim 14, further comprising, after defining the first monolithic body, removing the second supporting wafer and cutting the composite body into a plurality of devices.

18. A micro-electro-mechanical device, comprising:
a first monolithic body including semiconductor material, wherein the first monolithic body includes a fixed part, a movable part forming a frame surrounding the fixed part, and elastic elements configured to elastically couple the movable part and the fixed part to support oscillation of the movable part relative to the fixed part about an oscillation axis;
a plurality of projections extending perpendicularly from a surface of the movable part;
a second monolithic body including semiconductor material, wherein the second monolithic body has a bottom surface mounted to the plurality of projections with the second monolithic body extending over the movable part of the first monolithic body; and
a mirror layer mounted to a top surface of the second monolithic body that is opposite the bottom surface.

19. The micro-electro-mechanical device of claim 18, wherein said movable part includes actuation elements that are configured to control the oscillation of the movable part relative to the fixed part about the oscillation axis.

20. The micro-electro-mechanical device of claim 19, wherein the actuation elements are selected from the group consisting of: magnetic actuation elements, electrostatic actuation elements, and piezoelectric actuation elements.

* * * * *